United States Patent
Nakagawa

(10) Patent No.: US 7,486,209 B2
(45) Date of Patent: *Feb. 3, 2009

(54) DEMODULATION TABLE, DEMODULATING DEVICE AND DEMODULATING METHOD, PROGRAM, AND RECORDING MEDIUM

(75) Inventor: Toshiyuki Nakagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/558,296

(22) Filed: Nov. 9, 2006

(65) Prior Publication Data

US 2007/0115155 A1 May 24, 2007

(30) Foreign Application Priority Data

Nov. 10, 2005 (JP) ............................ P2005-326606

(51) Int. Cl.
*H03M 7/00* (2006.01)

(52) U.S. Cl. ............................ 341/59; 341/65; 341/67; 341/68; 341/69; 341/106

(58) Field of Classification Search ................... 341/59, 341/65, 67, 68, 69, 106
See application file for complete search history.

(56) References Cited

U.S. PATENT DOCUMENTS

| | | | |
|---|---|---|---|
| 5,506,581 A | 4/1996 | Ino et al. | |
| 5,881,037 A * | 3/1999 | Tanaka et al. | 369/59.24 |
| 6,072,756 A * | 6/2000 | Shigenobu | 369/47.19 |
| 6,172,622 B1 * | 1/2001 | Nakagawa et al. | 341/59 |
| 6,198,710 B1 * | 3/2001 | Hori et al. | 369/59.24 |
| 6,445,313 B2 * | 9/2002 | Ahn | 341/59 |
| 6,496,541 B1 | 12/2002 | Kahlman et al. | |
| 6,677,866 B2 * | 1/2004 | Kahlman et al. | 341/59 |
| 6,982,660 B2 * | 1/2006 | Nakagawa et al. | 341/58 |
| 7,158,060 B2 * | 1/2007 | Kahlman et al. | 341/67 |
| 7,215,261 B2 * | 5/2007 | Ushiyama et al. | 341/59 |
| 7,256,718 B2 * | 8/2007 | Nakagawa et al. | 341/59 |
| 7,266,153 B2 * | 9/2007 | Nakagawa et al. | 375/253 |
| 2005/0140528 A1 * | 6/2005 | Ushiyama et al. | 341/59 |

FOREIGN PATENT DOCUMENTS

| | | |
|---|---|---|
| JP | 6-197024 | 4/1994 |
| JP | 11-346154 | 12/1999 |

OTHER PUBLICATIONS

U.S. Appl. No. 11/556,946, filed Nov. 6, 2006, Nakagawa.*

* cited by examiner

*Primary Examiner*—Linh V Nguyen
(74) *Attorney, Agent, or Firm*—Bell, Boyd & Lloyd LLP

(57) ABSTRACT

A demodulation table for converting variable length code (d, k; m, n; r) is provided. The variable length code has a maximum constraint length r>1, has a minimum run of d (d>0), has a maximum run of k, and a basic codeword length of n bits into data having a basic data length of m bits. The demodulation table includes: a basic table for converting code patterns composed of basic codes having a basic codeword length of n bits into data patterns composed of basic data having a basic data length of m bits; and a substitution table for converting code patterns of a plurality of different minimum run successive occurrence limiting patterns determined so as to limit successive occurrences of the minimum run to a maximum of N (N>1) times into a corresponding identical data pattern.

16 Claims, 14 Drawing Sheets

DEMODULATION TABLE, DEMODULATING DEVICE AND DEMODULATING METHOD, PROGRAM, AND RECORDING MEDIUM

CROSS REFERENCE TO RELATED APPLICATIONS

The present application claims priority to Japanese Patent Application JP 2005-326606 filed in the Japanese Patent Office on Nov. 10, 2005, the entire contents of which being incorporated herein by reference.

BACKGROUND

The present disclosure relates to a demodulation table, a device and a method for demodulation, a program, and a recording medium, and particularly to a demodulation table, a device and a method for demodulation, a program, and a recording medium that further reduce successive occurrences of a minimum run.

When data is to be transmitted to a predetermined transmission line or to be recorded onto a recording medium such for example as a magnetic disk, an optical disk, or a magneto-optical disk, the data is modulated to become suitable for the transmission line or the recording medium. Known as one of methods of such modulation is a block code. The block code blocks a data string into units (hereinafter referred to as data words) each including m×i bits, and converts the data words to codewords each including n ×i bits according to an appropriate code rule. When i=1, this code is fixed length code. When a plurality of values can be selected for i, that is, a predetermined i in a range of one to i max (a maximum of i), and then conversion is performed, the code is variable length code. The block-coded code is expressed as variable length code (d, k; m, n; r).

In this code, i is referred to as a constraint length, and i max is r (maximum constraint length). d denotes for example a minimum number of consecutive "0"s inserted between successive "1"s, that is, a minimum run of "0"s. k denotes for example a maximum number of consecutive "0"s inserted between successive "1"s, that is, a maximum run of "0"s.

When codewords obtained as described above are to be recorded onto an optical disk, a magneto-optical disk or the like, in the case of a compact disk (CD) or a Mini-Disc (MD) (registered trademark), for example, a variable length code string is subjected to NRZI (Non Return to Zero Inverted) modulation, in which inversion is performed for "1" and inversion is not performed for "0", and recording is performed on the basis of the NRZI-modulated variable length code (hereinafter referred to as a recording waveform string). This recording is referred to as mark edge recording. On the other hand, in the case of an ISO-standard 3.5-inch magneto-optical disk with a capacity of 230 MB or the like, a code string resulting from recording modulation is recorded as it is without being subjected to NRZI modulation. This recording is referred to as mark position recording. The mark edge recording is often used for current recording media, which have been increased in recording density.

Letting Tmin be a minimum inversion interval of the recording waveform string and Tmax be a maximum inversion interval of the recording waveform string, a longer minimum inversion interval Tmin, or a larger minimum run d is preferred for high recording density in a linear velocity direction. From a viewpoint of clock reproduction, a shorter maximum inversion interval Tmax, or a smaller maximum run k is preferable. When overwriting characteristics are considered, it is preferable that Tmax/Tmin be smaller. Further, it is important from a viewpoint of jitter and S/N that a detection window width Tw=m/n be large, for example. Thus, various modulating methods have been proposed in light of conditions of media, and put to practical use.

Specific modulating systems proposed or actually used for optical disks, magnetic disks, magneto-optical disks, and the like are as follows. An EFM code (also denoted as (2, 10; 8, 17; 1)) used for CDs and MDs, an 8-16 code (also denoted as (2, 10; 1, 2; 1)) used for DVDs, and RLL(2, 7) (also denoted as (2, 7; m, n; r)) used for PDs (120 mm and a capacity of 650 MB) are RLL codes with a minimum run d=2. RLL(1, 7) (also denoted as (1, 7; 2, 3; r)) used for MD-DATA2 or an ISO-standard 3.5-inch MO (a capacity of 640 MB) is an RLL code with a minimum run d=1. In addition, recording and reproduction disk devices for optical disks, magneto-optical disks and the like having high recording densities, which are currently being developed and studied, often use an RLL code (Run Length Limited code) with a minimum run length d=1, in which the size of a smallest mark and conversion efficiency are balanced.

The following table, for example, is known as a conversion table of the variable length RLL (1, 7) code.

TABLE 1

RLL(1, 7): (d, k; m, n; r) = (1, 7; 2, 3; 2)

|  | Data Pattern | Code Pattern |
| --- | --- | --- |
| i = 1 | 11 | 00x |
|  | 10 | 010 |
|  | 01 | 10x |
| i = 2 | 0011 | 000 00x |
|  | 0010 | 000 010 |
|  | 0001 | 100 00x |
|  | 0000 | 100 010 |

A symbol x in the conversion table is "1" when a following channel bit id "0", and is "0" when the following channel bit is "1". The maximum constraint length r is two.

Parameters of varable length RLL (1, 7) are (1, 7; 2, 3; 2). Letting T be a bit interval of the recording waveform string, the minimum inversion interval Tmin expressed by (d+1)T is 2 (=1+1) T. Letting Tdata be a bit interval of the data string, the minimum inversion interval Tmin expressed by (m/n)×2 is 1.33 (=(2/3)×2) Tdata. The maximum inversion interval Tmax expressed by (k+1)T is Tmax=8 (=7+1) T (=m/n)×8 Tdata=(2/3)×8 Tdata=5.33 Tdata). The detection window width Tw is expressed by (m/n)×Tdata. The value of the detection window width Tw is Tw=0.67 (=2/3) Tdata.

In a channel bit string resulting from modulation in accordance with the RLL (1, 7) of table 1, 2T, which is Tmin, occurs most frequently, and the frequencies of occurrences of 3T, 4T, 5T, 6T . . . are decreased in that order. Repetition of 2T as the minimum run, that is, frequent occurrence of edge information in short cycles is often advantageous for clock reproduction.

However, in recording and reproduction of an optical disk, for example, as recording linear density is further increased, an error tends to occur at parts of the minimum run. This is because in disk reproduction, a waveform output of the minimum run is smaller than waveform outputs of other runs and is thus easily affected by for example a defocus and a tangential tilt. In addition, recording and reproduction of successive minimum marks at a high recording linear density is easily affected by disturbances such as noise and the like. Thus, a data reproduction error tends to occur. As a pattern of the data reproduction error at this time, an error in which an entire length of successive smallest marks from a first edge to a last edge is shifted can occur. That is, the length of a bit error that occurs extends from a start to an end of the section of the successive smallest marks. Therefore a problem of a long error propagation occurs.

Thus, for stable recording and reproducing of data at a high recording linear density, limiting successive occurrences of the minimum run is effective.

When data is to be recorded onto a recording medium or the data is to be transmitted, coding modulation suitable for the recording medium or a transmission line is performed. When modulation codes include a low-frequency component, for example, variations in various error signals for a tracking error and the like in servo control of the disk device tend to occur, or jitter tends to occur. It is therefore desirable to suppress the low-frequency component of the modulation codes as much as possible.

As a method for suppressing the low-frequency component, there is DSV (Digital Sum Value) control. When a channel bit string is subjected to NRZI modulation (that is, level coding) to be converted into a recording code string, and codes are added up with "1" in the bit string (data symbols) taken as +1 and "0" in the bit string taken as −1, DSV represents a total sum of the added-up codes. The DSV serves as an indicator of the low-frequency component of the recording code string. Decreasing the absolute values of positive and negative fluctuations in the DSV, that is, performing DSV control eliminates a direct-current component of the recording code string and suppresses the low-frequency component.

DSV control is not applied to modulation codes generated according to the variable length RLL (1, 7) table shown as Table 1. DSV control in such a case is achieved by performing a DSV calculation at predetermined intervals in a coded string (channel bit string) after modulation and inserting predetermined DSV control bits in the coded string (channel bit string) (Patent Document 1, for example).

The number of DSV control bits to be inserted in the channel bit string is determined by the minimum run d. When d=1, and when DSV control bits are to be inserted at an arbitrary position of codewords in such a manner as to keep the minimum run, two (=d+1) channel bits are necessary. When DSV control bits are to be inserted at an arbitrary position of codewords in such a manner as to keep the maximum run, four (=2×(d+1)) channel bits are necessary. When DSV control is to be performed with fewer channel bits than these channel bits, DSV control may not be achieved, depending on a preceding pattern and a succeeding pattern between which the channel bits are interposed.

In the RLL(1, 7) code with (d, k; m, n)=(1, 7; 2, 3), when the above DSV control bits are converted into data with the conversion rate, 4 channel bits×2/3=8/3= about 2.67 data pieces (2.67 Tdata)

The DSV control bits are basically redundant bits. Thus, from a viewpoint of efficiency of code conversion, it is desirable to reduce the number of DSV control bits as much as possible.

Further, it is desirable not to allow the minimum run d and the maximum run k to be changed by inserted DSV control bits. This is because a change in (d, k) affects recording and reproduction characteristics.

In an actual RLL code, however, the minimum run must be kept because the minimum run greatly affects recording and reproduction characteristics, but the maximum run is not necessarily kept. In some cases, there is a format in which a pattern that breaks the maximum run is used as a synchronizing signal. For example, while a maximum run in the 8-16 code of DVD (Digital Versatile Disk) is 11 T, 14 T exceeding the maximum run is given in a part of a synchronizing pattern to enhance a capability of detecting the synchronizing signal.

On the basis of the above, the present inventors have previously proposed a 1,7PP code of Table 2 as a modulation system with (d, k)=(1, 7) which system is ready for high recording densities (see Japanese Patent Laid-Open No. Hei 11-346154).

TABLE 2

| 1,7PP: (d, k; m, n; r) = (1, 7; 2, 3; 4) | |
|---|---|
| Data Pattern | Code Pattern |
| 11 | *0* |
| 10 | 001 |
| 01 | 010 |
| 0011 | 010 100 |
| 0010 | 010 000 |
| 0001 | 000 100 |
| 000011 | 000 100 100 |
| 000010 | 000 100 000 |
| 000001 | 010 100 100 |
| 000000 | 010 100 000 |
| 110111 | 001 000 000 (next 010) |
| 00001000 | 000 100 100 100 |
| 00000000 | 010 100 100 100 | if xx1 then *0* = 000
xx0 then *0* = 101

The conversion table of Table 2 includes, as conversion patterns, basic patterns without which conversion processing cannot be carried out (data patterns (11) to (000000)), substitution patterns without which conversion processing can be carried out, but with which more effective conversion processing can be carried out (data patterns (110111), (00001000), and (00000000)), and terminating patterns for terminating a data string at an arbitrary position (data patterns (00) and (0000)).

In addition, Table 2 includes an indeterminate code (*) as an element of a basic pattern, with a minimum run d=1 and a maximum run k=7. The indeterminate code * is set to "0" or "1" so as to keep the minimum run d and the maximum run k regardless of an immediately preceding codeword and an immediately succeeding codeword. Specifically, in Table 2, when two-piece data to be converted is (11), "000" or "101" is selected depending on an immediately preceding codeword string (channel bit string), and the data to be converted is converted to one of the code patterns "000" and "101". For example, when one channel bit of the immediately preceding codeword string is "1", the two-piece data (11) is converted to the codeword "000" to keep the minimum run d. When one channel bit of the immediately preceding codeword string is "0", the two-piece (11) is converted to the codeword "101" to keep the maximum run k.

The basic patterns of the conversion table of Table 2 have a variable length structure. That is, the number of basic patterns at a constraint length i=1 is three (the three patterns *0*, 001, and 010), which is smaller than a required number of four (=2^m=2^2=4). As a result, in converting data strings, there are data strings that cannot be converted with only a constraint length i=1. After all, in order to convert all data strings in Table 2 (to complete Table 2 as a conversion table), it is necessary to refer to basic patterns up to a constraint length i=3.

In addition, the conversion table of Table 2 has a substitution pattern for limiting successive occurrences of the minimum run d. Thus, when a data string is (110111), a succeeding code string is further referred to, and when the succeeding code string is "010", the six-piece data is replaced with the codeword "001 000 000". When the succeeding code string is other than "010", the data string is converted as units of two-piece data ((11), (01), and (11)) into a codeword, and hence converted into a codeword "*0*010 *0*". Thus, successive occurrences of the minimum run in a codeword string resulting from conversion of data are limited, and the minimum run is repeated six times at a maximum.

The conversion table of Table 2 has a maximum constraint length r=4. Conversion patterns with a constraint length i=4 are formed by substitution patterns (maximum run guaranteeing patterns) for realizing the maximum run k=7. Specifically, the data pattern (00001000) is converted to the code pattern "000 100 100 100", and the data pattern (00000000) is converted to the code pattern "010 100 100 100". Also in this case, the minimum run d=1 is kept.

Further, in Table 2, when termination is effected at an arbitrary position of a data string to insert a synchronizing pattern, and when the data string has (00) or (0000) at a terminating position, a termination pattern is used. The inserted synchronizing pattern has a first codeword as a termination pattern use identifying bit. When a termination pattern is used, the first codeword of the immediately succeeding substitution pattern string is "1". When no termination pattern is used, the first codeword is "0". Incidentally, the synchronizing pattern in Table 2 is formed by a total of 24 codewords including the above-mentioned termination pattern use identifying bit and two repetitive codewords with k=8 exceeding the maximum run k=7 for detection of the synchronizing pattern.

The conversion patterns in Table 2 have a conversion rule that a remainder when the number of "1"s of elements of a data pattern is divided by two and a remainder when the number of "1"s of elements of a code pattern is divided by two be both 1 or 0 and thus equal to each other (both elements corresponding to each other have an odd number of "1"s or an even number of "1"s). For example, the data pattern (000001) of the conversion patterns corresponds to the code pattern "010 100 100". The number of "1"s of the elements of the data pattern is one, and the number of "1"s of the elements of the corresponding code pattern is three. A remainder when the number of "1"s as an element of the data pattern is divided by two and a remainder when the number of "1"s as an element of the code pattern is divided by two are both one (an odd number) and thus match each other. Similarly, the data pattern (000000) of the conversion patterns corresponds to the code pattern "010 100 000". The number of "1"s as an element of the data pattern is zero, and the number of "1"s as an element of the corresponding code pattern is two. A remainder when the number of "1"s as an element of the data pattern is divided by two and a remainder when the number of "1"s as an element of the code pattern is divided by two are both zero (an even number) and thus match each other.

A method of performing DSV control will next be described. DSV control when the DSV control is not performed in a modulation table as in the RLL(1, 7) code of Table 1 is performed by adding at least (d+1) bits at predetermined intervals to a channel bit string after modulation of a data string. On the other hand, in a conversion table such as Table 2, though the same DSV control as in the case of Table 1 can be performed, DSV control can be performed more efficiently by utilizing relations between the data patterns and the converted code patterns in Table 2. Specifically, when the conversion table has the conversion rule that a remainder when the number of "1"s within a data pattern is divided by two and a remainder when the number of "1"s within a code pattern is divided by two be both 1 or 0 and thus the same, insertion of a DSV control bit of "1" representing "inversion" or "0" representing "non-inversion" in a channel bit string as described above is equivalent to insertion of a DSV control bit of (1) for "inversion" or (0) for "non-inversion" in a data bit string.

When a DSV control bit is inserted at the rear of a sequence of three bits (001) to be subjected to data conversion in Table 2, for example, data is (001-x) (x is one bit of "0" or "1"). When "0" is assigned to x, the following conversion is performed in the conversion table of Table 2.

| Data Pattern | Code Pattern |
|---|---|
| 0010 | 010 000 |

When "1" is assigned to x, the following conversion is performed in the conversion table of Table 2.

| Data Pattern | Code Pattern |
|---|---|
| 0011 | 010 100 |

The codeword strings are subjected to NRZI modulation, and thereby the following level code strings are generated.

| Data Pattern | Code Pattern | Level Code String |
|---|---|---|
| 0010 | 010 000 | 011 111 |
| 0011 | 010 100 | 011 000 |

The last three bits of these level code strings are in inverted relation to each other. This means that DSV control can be performed also in a data string by selecting (1) and (0) as the DSV control bit x.

Considering redundancy due to DSV control, performing DSV control with one bit in a data string is equivalent to performing DSV control with 1.5 channel bits when expressed in terms of a channel bit string on the basis of the conversion rate (m:n=2:3) of Table 2. On the other hand, to perform DSV control in an RLL(1, 7) table such as Table 1, DSV control needs to be performed in a channel bit string. At this time, at least two channel bits are required to keep the minimum run, and redundancy is increased as compared with the DSV control of Table 2. In other words, with the table structure of Table 2, DSV control is performed in a data string, and therefore DSV control can be performed efficiently.

Further, the present inventor et al. have proposed the following Table 3 as an inverse conversion table (demodulation table) for the 1,7PP code of Table 2 (for example, Japanese Patent Laid-Open No. Hei 11-346154).

TABLE 3

1,7PP_DEM: (d, k; m, n; r) = (1, 7; 2, 3; 4)

| | Code Pattern | Data Pattern |
|---|---|---|
| i = 1 | 101 | 11 |
| | 000 | 11 |
| | 001 | 10 |
| | 010 | 01 |
| i = 2 | 010 100 | 0011 |
| | 010 000 (not 100) | 0010 |
| | 000 100 | 0001 |

TABLE 3-continued 1,7PP_DEM: (d, k; m, n; r) = (1, 7; 2, 3; 4)

|   | Code Pattern | Data Pattern |
|---|---|---|
| i = 3 | 000 100 100 | 000011 |
|   | 000 100 000 (not 100) | 000010 |
|   | 010 100 100 | 000001 |
|   | 010 100 000 (not 100) | 000000 |
| i = 3: | Prohibit Repeated Minimum Transition Runlength | |
|   | 001 000 000 (not 100) | 110111 |
| i = 4: | limits k to 7 | |
|   | 000 100 100 100 | 00001000 |
|   | 010 100 100 100 | 00000000 |

A demodulation process is carried out by performing comparison to find a pattern matching an input codeword string in decreasing order of constraint length in the above inverse conversion table of Table 3 and then performing conversion, for example, whereby an original data string can be obtained. The inverse conversion table of Table 3 has one minimum run successive occurrence limiting pattern (inverse conversion pattern) as a substitution pattern at a constraint length i=3 to limit successive occurrences of the minimum run to six times. A synchronizing pattern is the same as shown in Table 2, and a demodulation process is carried out according to an inverse conversion table as in Table 3 with a detected position as a reference.

The modulation table of Table 2 ready for high recording densities which table has the minimum run and the maximum run (d, k)=(1, 7) as described above and the demodulation table of Table 3 corresponding to Table 2 are employed as a format of Blu-ray Disc Rewritable ver1.0 (registered trademark) as a high-density optical disk, for example.

For still higher recording densities in the future, or specifically, for example, for still higher density standards for high-density optical disks, a more stable modulation and demodulation system is desired.

When a demodulation system for implementing a more stable system with the configuration of a similar table to that of the conventional 1,7PP code is realized for the already commercialized Blu-ray Disc Rewritable ver1.0, conventional design technology can be used, and thus a design risk at the time of hardware design can be reduced.

Further, with a demodulation configuration including all of the conventional 1,7PP code, it is possible to demodulate data modulated by the conventional 1,7PP code and recorded.

However, when RLL codes are recorded and reproduced at a high linear density, a long error tends to occur at a pattern where the minimum run d occurs successively. In addition, to perform DSV control in (1, 7; 2, 3) codes, redundant bits need to be inserted, and the redundant bits need to be reduced as much as possible. Then, in an RLL code (d, k; m, n)=(1, 7; 2, 3) with a minimum run d=1 which code was developed in view of such a situation, a demodulation table and a demodulating device corresponding to a modulation table for generating a more stable code string than 1,7PP codes are desired, the 1,7PP codes having for example features of limiting the number of successive occurrences of the minimum run and enabling DSV control to be performed with efficient control bits while the minimum run and the maximum run are kept. Specifically, a demodulation system is desired which further reduces occurrences of errors caused by an edge shift.

Further, for reproduction compatibility with the conventional 1,7PP code and for facilitation of hardware commonality and hardware design, a table including the conventional 1,7PP table and having a similar table configuration to that of the conventional 1,7PP table is desired.

SUMMARY

The present disclosure is in view of the above, and it is desirable to make a basic configuration similar to that of the 1,7PP code, take reproduction compatibility with the conventional 1,7PP code into consideration, make the number of successive occurrences of the minimum run even smaller than conventional, and prevent occurrence of a long error at times of recording and reproduction.

An embodiment is a demodulation table for converting variable length code (d, k; m, n; r) (a maximum constraint length r>1) having a minimum run of d (d>0), a maximum run of k, and a basic codeword length of n bits into data having a basic data length of m bits, the demodulation table including: a basic table for converting code patterns composed of basic codes having a basic codeword length of n bits into data patterns composed of basic data having a basic data length of m bits; and a substitution table for converting code patterns of a plurality of different minimum run successive occurrence limiting patterns determined so as to limit successive occurrences of the minimum run to a maximum of N (N>1) times into a corresponding identical data pattern.

The data pattern corresponding to the code pattern of a minimum run successive occurrence limiting pattern can include a data pattern corresponding to a code pattern of another minimum run successive occurrence limiting pattern as a part of the data pattern.

The demodulation table can have a conversion rule that a remainder when a number of "1"s within a data pattern is divided by two and a remainder when a number of "1"s within a code pattern is divided by two be both one of 1 and 0 and thus match each other.

The demodulation table can further include a substitution table for converting code patterns determined so as to limit the maximum run to M (M>0) into corresponding data patterns.

With d=1, k=7, m=2, and n=3, successive occurrences of the minimum run can be limited to a maximum of five times.

Another embodiment is a demodulating device for converting variable length code (d, k; m, n; r) (a maximum constraint length r>1) having a minimum run of d (d>0), a maximum run of k, and a basic codeword length of n bits into data having a basic data length of m bits, the demodulating device including: first converting means for converting an input codeword string into a data string according to a first demodulation table including basic code patterns and basic data patterns associated with the basic code patterns; second converting means for converting an input codeword string into a data string according to a second demodulation table including code patterns of a plurality of different minimum run successive occurrence limiting patterns determined so as to limit successive occurrences of the minimum run to a maximum of N (N>1) times and an identical data pattern associated with the code patterns; first detecting means for detecting the code patterns of the minimum run successive occurrence limiting patterns; and selecting means for selecting the data string converted according to the second demodulation table when a minimum run successive occurrence limiting pattern is detected.

The demodulating device can further include second detecting means for detecting a code pattern including the code pattern of at least one minimum run successive occurrence limiting pattern as a part of the code pattern, wherein the selecting means can select one of data strings converted according to a first part of the first demodulation table and a second part of the first demodulation table using a result indicating whether a code pattern including the code pattern of one minimum run successive occurrence limiting pattern as a part of the code pattern is detected.

The selecting means can select a data string converted according to a basic code pattern in a minimum unit and a basic data pattern associated with the basic code pattern.

The demodulating device can further include extracting means for removing one of a synchronizing pattern and a DSV control bit inserted at a predetermined position from the data string selected by the selecting means, and extracting data bits.

The demodulating device can further include codeword string converting means for generating the codeword string from an input signal.

The demodulating device can further include synchronizing pattern detecting means for detecting a synchronizing pattern inserted at a predetermined position from the input codeword string.

The first demodulation table can further include code patterns determined so as to limit the maximum run to M (M>0) and data patterns associated with the code patterns.

Another embodiment is a demodulating method, a program, or a recording medium on which the program is recorded, the demodulating method or the program converting variable length code (d, k; m, n; r) (a maximum constraint length r>1) having a minimum run of d (d>0), a maximum run of k, and a basic codeword length of n bits into data having a basic data length of m bits, the demodulating method or the program including: a first converting step of converting an input codeword string into a data string according to a first demodulation table including basic code patterns and basic data patterns associated with the basic code patterns; a second converting step of converting an input codeword string into a data string according to a second demodulation table including code patterns of a plurality of different minimum run successive occurrence limiting patterns determined so as to limit successive occurrences of the minimum run to a maximum of N (N>1) times and an identical data pattern associated with the code patterns; a detecting step of detecting the code patterns of the minimum run successive occurrence limiting patterns; and a selecting step of selecting the data string converted according to the second demodulation table when the code pattern of a minimum run successive occurrence limiting pattern is detected.

In an embodiment, a demodulation table includes: a basic table for converting code patterns composed of basic codes having a basic codeword length of n bits into data patterns composed of basic data having a basic data length of m bits; and a substitution table for converting code patterns of a plurality of different minimum run successive occurrence limiting patterns determined so as to limit successive occurrences of the minimum run to a maximum of N (N>1) times into a corresponding identical data pattern.

In another embodiment, an input codeword string is converted into data strings according to a first demodulation table and a second demodulation table. When the code pattern of a minimum run successive occurrence limiting pattern is detected, the data string converted according to the second demodulation table is selected.

According to the embodiments of the present invention, it is possible to further decrease the number of successive occurrences of the minimum run. In addition, according to the embodiments, it is possible to further reduce occurrences of errors.

Additional features and advantages are described herein, and will be apparent from, the following Detailed Description and the figures.

DETAILED DESCRIPTION

Embodiments are hereinafter described.

An embodiment is a demodulation table (for example a demodulation table of Table 4) for converting variable length code (d, k; m, n; r) (a maximum constraint length r>1) having a minimum run of d (d>0), a maximum run of k, and a basic codeword length of n bits into data having a basic data length of m bits, the demodulation table including: a basic table (for example a basic table in Table 4) for converting code patterns composed of basic codes having a basic codeword length of n bits into data patterns composed of basic data having a basic data length of m bits; and a substitution table (for example a substitution table in Table 4) for converting code patterns (for example code patterns "101 010 000 000 101" and "000 010 000 000 101" in Table 4) of a plurality of different minimum run successive occurrence limiting patterns determined so as to limit successive occurrences of the minimum run to a maximum of N (N>1) times into a corresponding identical data pattern (for example a data pattern (1001110111) in Table 4).

The data pattern (for example the data pattern (1001110111) in Table 4) corresponding to the code pattern (for example the code pattern "101 010 000 000 101" in Table 4) of a minimum run successive occurrence limiting pattern can include a data pattern (for example a data pattern (110111)) corresponding to a code pattern (for example a code pattern "001 000 000" in Table 4) of another minimum run successive occurrence limiting pattern as a part of the data pattern.

The demodulation table can further include a substitution table for converting code patterns (for example code patterns "000 100 100 100" and "010 100 100 100" in Table 4) determined so as to limit the maximum run to M (M>0) into corresponding data patterns (for example data patterns (00001000) and (00000000) in Table 4).

Figure 3:
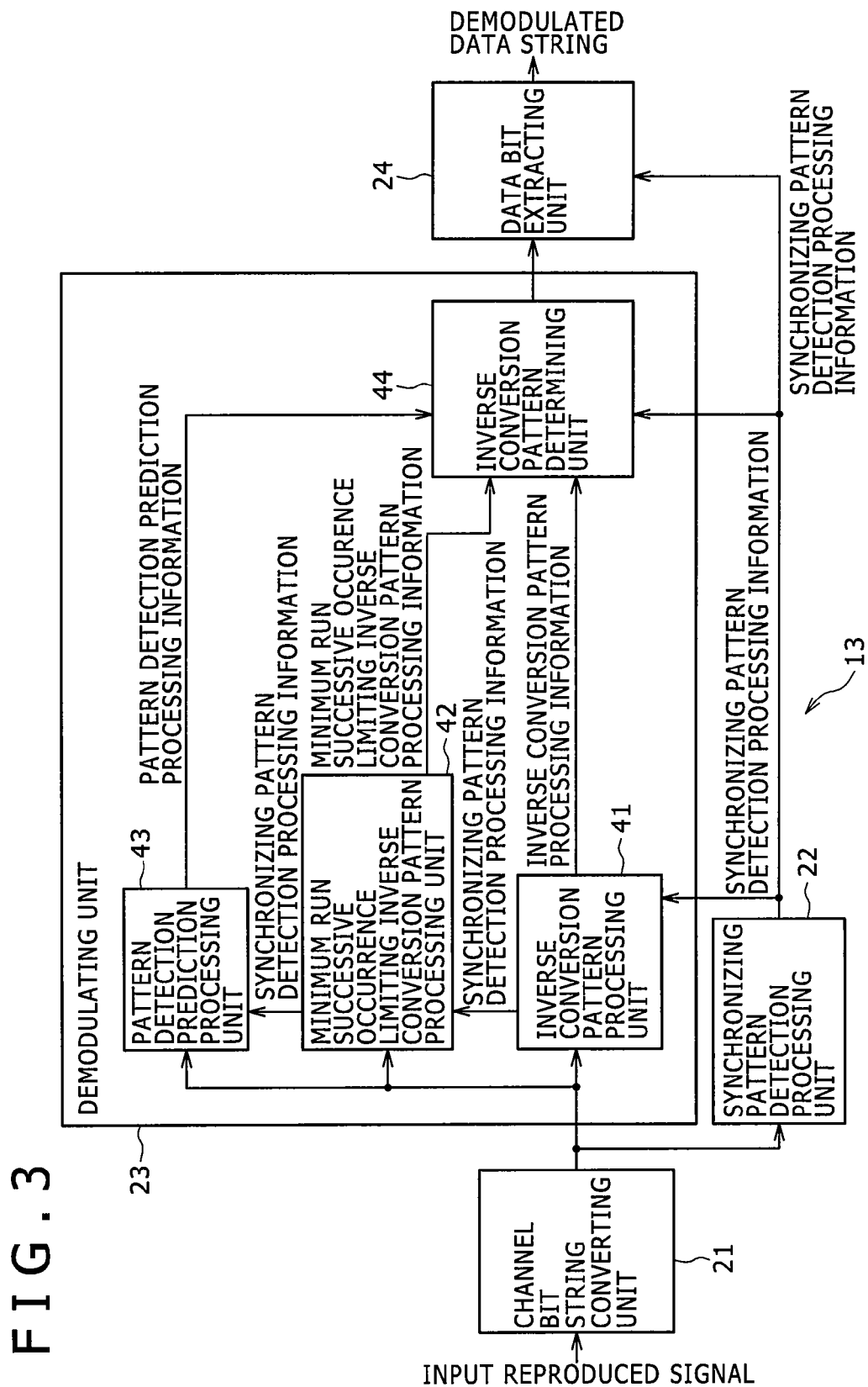
FIG. 3 is a block diagram showing a more detailed configuration of main parts of a decoding device in FIG. 1.
Figure 4:
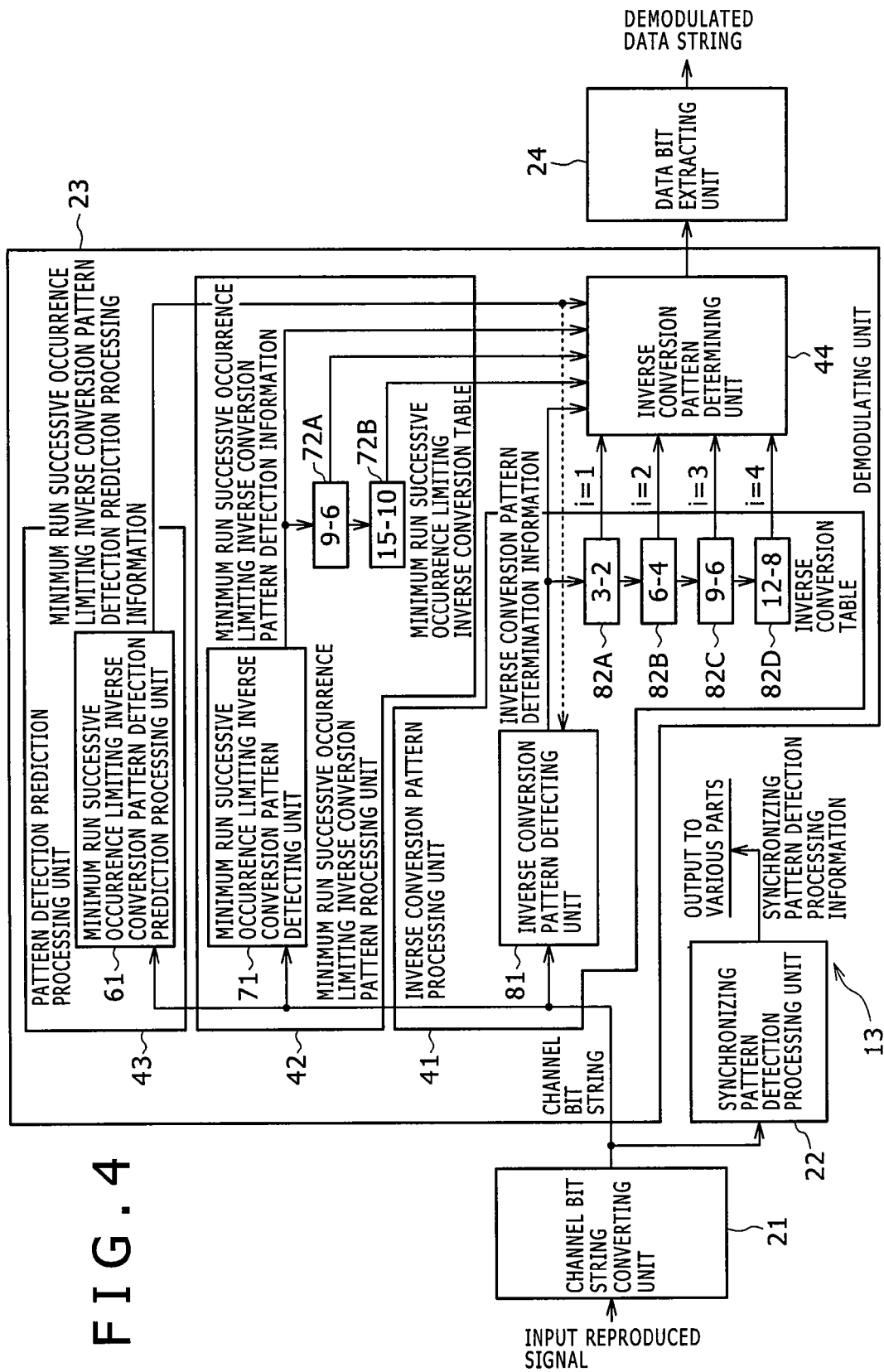
FIG. 4 is a block diagram showing a still more detailed configuration of main parts of the decoding device of FIG. 3.
Figure 11:
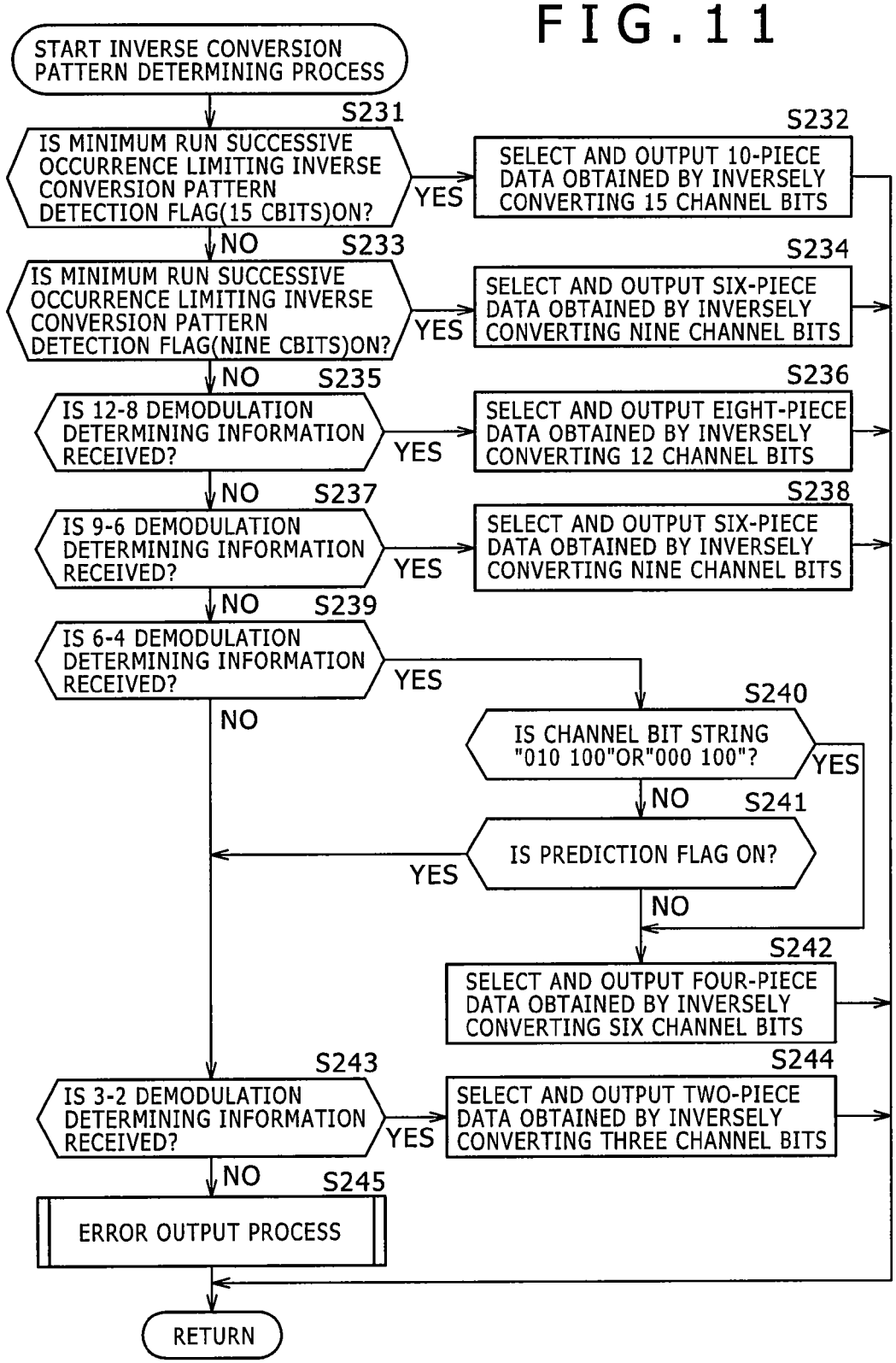
FIG. 11 is a flowchart of assistance in explaining an inverse conversion pattern determining process in step S7 in FIG. 5.

Another embodiment is a demodulating device (for example a demodulating device 1 in FIG. 1) including: first converting means (for example an inverse conversion pattern processing unit 41 in FIG. 3) for converting an input codeword string into a data string according to a first demodulation table (for example inverse conversion tables 82A to 82C in FIG. 4) including basic code patterns and basic data patterns associated with the basic code patterns (for example a basic table in Table 4); second converting means (for example a minimum run successive occurrence limiting inverse conversion table 72B in FIG. 4) for converting an input codeword string into a data string according to a second demodulation table (for example conversion patterns with a constraint length=5 in Table 4) including code patterns of a plurality of different minimum run successive occurrence limiting patterns determined so as to limit successive occurrences of the minimum run to a maximum of N (N>1) times and an identical data pattern associated with the code patterns; first detecting means (for example a minimum run successive occurrence limiting inverse conversion pattern detecting unit 71 in FIG. 4) for detecting the code patterns of the minimum run successive occurrence limiting patterns (for example code patterns "101 010 000 000 101" and "000 010 000 000 101" in Table 4); and selecting means (for example an inverse conversion pattern determining unit 44 in FIG. 3 that performs a process of step S232 in FIG. 11) for selecting the data string converted according to the second demodulation table when a minimum run successive occurrence limiting pattern is detected (for example when it is determined in step S231 in FIG. 11 that a minimum run successive occurrence limiting inverse conversion pattern detection flag (15 cbits) is on).

Figure 6:
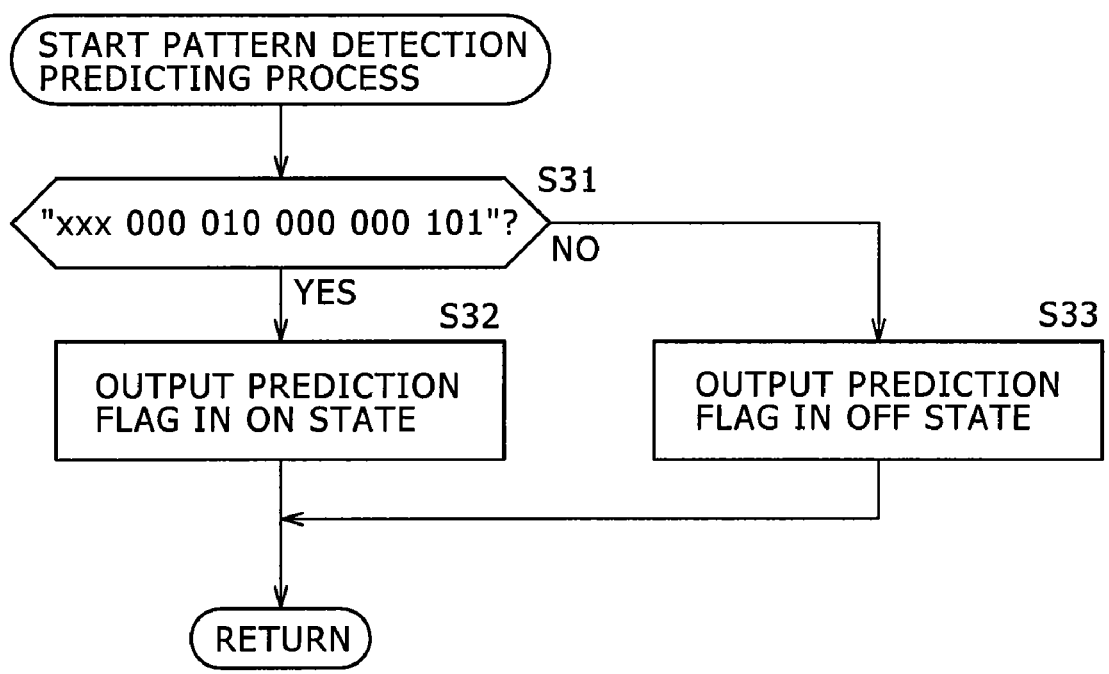
FIG. 6 is a flowchart of assistance in explaining a pattern detection predicting process in step S4 in FIG. 5.

The demodulating device can further include second detecting means (for example a pattern detection prediction processing unit 43 in FIG. 3) for detecting a code pattern (for example a code pattern "xxx 000 010 000 000 101" in step S31 in FIG. 6) including the code pattern of at least one minimum run successive occurrence limiting pattern (for example the code pattern "000 010 000 000 101" in Table 4) as a part of the code pattern, wherein the selecting means can select one of data strings converted according to a first part (for example an inverse conversion table 82A in FIG. 4) of the first demodulation table and a second part (for example an inverse conversion table 82B in FIG. 4) of the first demodulation table using a result indicating whether a code pattern including the code pattern of one minimum run successive occurrence limiting pattern as a part of the code pattern is detected (for example a result indicating whether a prediction flag is on in step S241 in FIG. 11) (for example processes of steps S242, S243, and S244 in FIG. 11).

The selecting means can select a data string converted according to a basic code pattern in a minimum unit (for example a constraint length i=1 in Table 4) and a basic data pattern associated with the basic code pattern.

The demodulating device can further include extracting means (for example a data bit extracting unit 24 in FIG. 1) for removing one of a synchronizing pattern and a DSV control bit inserted at a predetermined position from the data string selected by the selecting means, and extracting data bits.

The demodulating device can further include codeword string converting means (for example a channel bit string converting unit 21) for generating the codeword string from an input signal.

Figure 1:
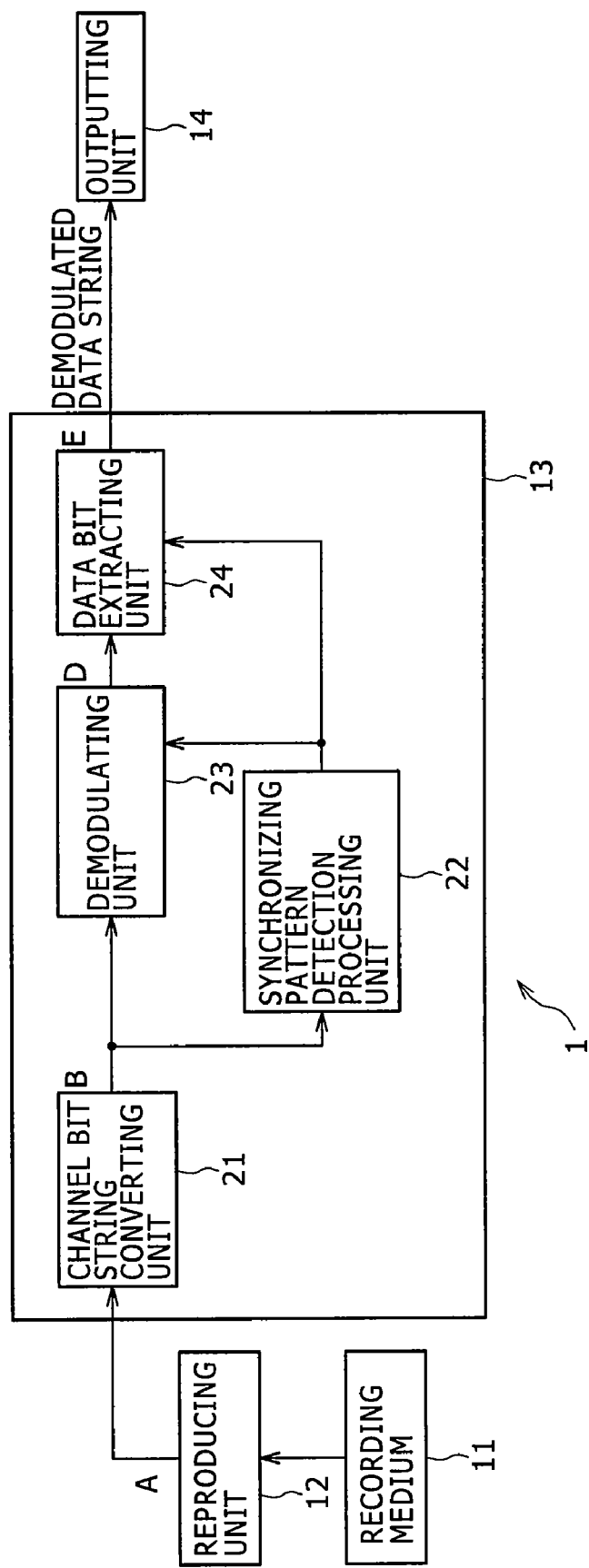
FIG. 1 is a block diagram showing a configuration of a demodulating device according to an embodiment.

The demodulating device can further include synchronizing pattern detecting means (for example a synchronizing pattern detection processing unit 22 in FIG. 1) for detecting a synchronizing pattern inserted at a predetermined position from the input codeword string.

The first demodulation table can further include code patterns determined so as to limit the maximum run to M (M>0) and data patterns associated with the code patterns (for example an inverse conversion table 82D in FIG. 4).

Another embodiment is a demodulating method (for example a demodulating method of a demodulating device 1 in FIG. 1) including: a first converting step (for example step S6 in FIG. 5) of converting an input codeword string into a data string according to a first demodulation table (for example inverse conversion tables 82A to 82C in FIG. 4) including basic code patterns and basic data patterns associated with the basic code patterns (for example a basic table in Table 4); a second converting step (for example step S54 in FIG. 7) of converting an input codeword string into a data string according to a second demodulation table (for example conversion patterns with a constraint length=5 in Table 4) including code patterns of a plurality of different minimum run successive occurrence limiting patterns determined so as to limit successive occurrences of the minimum run to a maximum of N (N>1) times and an identical data pattern associated with the code patterns; a detecting step (for example step S52 in FIG. 7) of detecting the code patterns of the minimum run successive occurrence limiting patterns (for example code patterns "101 010 000 000 101" and "000 010 000 000 101" in Table 4); and a selecting step (for example step S232 in FIG. 5) for selecting the data string converted according to the second demodulation table when a minimum run successive occurrence limiting pattern is detected (for example when it is determined in step S231 in FIG. 11 that a minimum run successive occurrence limiting inverse conversion pattern detection flag (15 cbits) is on).

Embodiments are hereinafter described with reference to the drawings. Hereinafter, a data string after demodulation will be represented in parentheses as in (000011), and a channel bit string before demodulation will be represented in quotation marks as in "000 100 100". A code that is a variable length code with a minimum run d=1, a maximum run k=7, and a conversion rate (m:n)=(2:3), and has a conversion table for performing perfect DSV control with efficient DSV control bits while limiting the number of successive occurrences of the minimum run and keeping the minimum run and the maximum run will be referred to as a 1,7PP code (PP: Parity-preserve Prohibit-repeated-minimum-transition-runlength).

The following Table 4 represents an example of a demodulation table (inverse conversion table) according to an embodiment of the present invention.

Incidentally, in the present disclosure, converting a data pattern into a code pattern will be expressed as conversion, and conversely converting a code pattern into a data pattern will be expressed as inverse conversion. A table describing conversion patterns for converting data patterns into code patterns will be expressed as a modulation table (conversion table), and a table describing conversion patterns (inverse conversion patterns) for converting code patterns into data patterns will be expressed as a demodulation table (inverse conversion table).

TABLE 4

1,7PP-rmtr5_DEM RLL(1, 7; 2, 3; 5)

| | Code Pattern (Codeword String) | Data Pattern (Demodulated Data String) |
|---|---|---|
| i = 1 | 101 | 11 |
| | 000 | 11 |
| | 001 | 10 |
| | 010 | 01 |
| i = 2 | 010 100 | 0011 |
| | 010 000 (not 100) | 0010 |
| | 000 100 | 0001 |
| i = 3 | 000 100 100 | 000011 |
| | 000 100 000 (not 100) | 000010 |
| | 010 100 100 | 000001 |
| | 010 100 000 (not 100) | 000000 |
| i = 4: | limits k | to 7 |
| | 000 100 100 100 | 00001000 |
| | 010 100 100 100 | 00000000 |
| | Prohibit Repeated Minimum Transition Runlength | |
| i = 3 | 001 000 000 (not 100) | 110111 |
| i = 5 | 101 010 000 000 101 | 1001110111 |
| | 000 010 000 000 101 | 1001110111 |

Termination Table

| | Code Pattern | Data Pattern |
|---|---|---|
| i = 1 | 000 | 00 |
| i = 2 | 010 100 | 0000 |

SYNC & Termination
01 010 000 000 010 000 000 010 (24 cbits)
=0 not terminate case
=1 terminate case The demodulation table (inverse conversion table) of Table 4 is an inverse conversion table for performing data demodulation on a codeword string that is 1,7PP code as variable length code (d, k; m, n; r)=(1, 7; 2, 3; 5) and in which successive occurrences of the minimum run are limited to five times.

The inverse conversion table of Table 4 is a 1,7PP code, and has a plurality of inverse conversion patterns for limiting successive occurrences of the minimum run while having a basic composition similar to that of Table 3. Specifically, the inverse conversion table of Table 4 includes a basic table having basic patterns without which conversion processing cannot be carried out, as inverse conversion patterns (code patterns (codeword strings) and data patterns (demodulated data strings)), a substitution table having substitution patterns without which conversion processing can be carried out, but with which more effective conversion processing can be carried out, and a termination table having terminating patterns for terminating a code at an arbitrary position.

The inverse conversion patterns of the basic table are composed of code patterns (basic code patterns) from "101" at a constraint length i=1 to "010 100 000 (not 100)" at a constraint length i=3, and data patterns (basic data patterns) from (11) to (000000) corresponding to the code patterns.

The inverse conversion patterns of the substitution table are composed of inverse conversion patterns for limiting the maximum run and inverse conversion patterns for limiting successive occurrences of the minimum run. Incidentally, the inverse conversion patterns of the substitution table will hereinafter be referred to also as substitution patterns.

The inverse conversion patterns (substitution patterns) for limiting the maximum run are composed of code patterns "000 100 100 100" and "010 100 100 100" with a constraint length i=4, and data patterns (00001000) and (00000000) corresponding to the code patterns. not 100 denotes that next three channel bits are not "100".

The inverse conversion patterns (substitution patterns) for limiting successive occurrences of the minimum run are composed of a code pattern "001 000 000 (not 100)" with a constraint length i=3 and code patterns "101 010 000 000 101" and "000 010 000 000 101" with a constraint length i=5, and data patterns (110111) and (1001110111) corresponding to the code patterns.

The inverse conversion patterns of the termination table are composed of termination code patterns formed by code patterns "000" to "010 100" and termination data patterns formed by data patterns (00) and (0000) corresponding to the termination code patterns.

Incidentally, a modulation table (conversion table) describes correspondences between data patterns and code patterns to convert a part of input data which part matches a data pattern into a corresponding code pattern when the part of the input data matches the data pattern, whereas a demodulation table (inverse conversion table) describes correspondences between code patterns and data patterns to inversely convert a part of an input code string which part matches a code pattern into a corresponding data pattern when the part of the input code string matches the code pattern. In the following, a part of Table 4 will also be described as a demodulation table (inverse conversion table) as needed.

In Table 4, both the code patterns "101" and "000" are inversely converted into the data pattern (11) because a code pattern "*0*" including an indeterminate code "*" is associated with the data pattern (11) with a minimum run d=1 and a maximum run k=7 in a corresponding conversion table (modulation table) (not shown). Similarly, both the code patterns "101 010 000 000 101" and "000 010 000 000 101" are inversely converted into the data pattern (1001110111) because a code pattern "$0$ 010 000 000 101" including an indeterminate code "$" is associated with the data (1001110111) in the conversion table (modulation table) to limit successive occurrences of the minimum run at a constraint length i=5.

The inverse conversion table of Table 4 has a variable length structure, and therefore has basic patterns from i=1 to i=3. When a basic pattern matches a code pattern to be converted at each constraint length i, the basic pattern is converted into a demodulated data string.

In addition, the inverse conversion table of Table 4 has substitution patterns for limiting successive occurrences of the minimum run d at a constraint length i=3. When a nine-bit codeword matches a code pattern "001 000 000", and further a following three-bit codeword matches a code pattern "010", the nine-bit codeword is converted into a data pattern (110111) as a demodulated data string. Incidentally, the nine-bit codeword may be converted into the data pattern (110111) when the nine-bit codeword matches the code pattern "001 000 000", and further the following three-bit codeword is code other than the code pattern "010". Then, the nine-bit codeword is converted into the data pattern (110111) not only when the three-bit codeword is "010" but also when the three-bit codeword is "101", "000", or "001" due to a reproduction error.

The inverse conversion table of Table 4 has substitution patterns (maximum run guaranteeing patterns) for realizing the maximum run k=7 in patterns with a constraint length i=4. Specifically, when a 12-bit codeword matches a code pattern "000 100 100 100", the codeword is converted to a data pattern (00001000). When the 12-bit codeword matches a code pattern "010 100 100 100", the codeword is converted to a data pattern (00000000).

The inverse conversion table of Table 4 further includes the code patterns "101 010 000 000 101" and "000 010 000 000 101" with a constraint length i =5 as inverse conversion patterns (substitution patterns) for limiting successive occurrences of the minimum run. The code patterns "101 010 000 000 101" and "000 010 000 000 101" are both associated with the same data pattern (1001 1101 11). This is because the data pattern (1001110111) is associated with a code pattern "$0$ 010 000 000 101" including an indeterminate code "$" in the modulation table corresponding to the demodulation table of Table 4.

Further, Table 4 has termination patterns used to insert a synchronizing pattern. A first codeword of a synchronizing pattern is termination pattern use identifying information. When a first codeword of a synchronizing pattern string is "1", code immediately preceding the synchronizing pattern is converted into a demodulated data string using termination patterns. When the first codeword of the synchronizing pattern string is "0", the code immediately preceding the synchronizing pattern is converted into a demodulated data string using other than termination patterns (using the basic table or the substitution table).

As described above, by Table 4, a codeword string in which (d, k; m, n; r)=(1, 7; 2, 3; 5) and successive occurrences of the minimum run are limited to five times can be demodulated into an original data string.

Incidentally, the inverse conversion table of Table 4 has all the elements of the inverse conversion table of Table 3.

An embodiment of a demodulating device will next be described with reference to drawings. FIG. 1 is a block diagram showing a general configuration of a demodulating device according to an embodiment.

As shown in FIG. 1, the demodulating device 1 includes: a reproducing unit 12 for outputting a signal transmitted from a transmission line or a signal recorded on a recording medium 11; a decoding device 13 for decoding the signal output from the reproducing unit 12; and an outputting unit 14 for outputting the signal from the decoding device 13 from a built-in display unit and a speaker or the like.

The decoding device 13 includes: a channel bit string converting unit 21 for binarizing a signal input from the reproducing unit 12, and subjecting the signal to inverse NRZI modulation as needed (when the signal is NRZI-modulated); a synchronizing pattern detection processing unit 22 for detecting a synchronizing pattern inserted in a predetermined position at a predetermined interval from a channel bit string output from the channel bit string converting unit 21, and synchronizing a start position of demodulation processing in a subsequent stage; a demodulating unit 23 for demodulating the channel bit string output from the channel bit string converting unit 21 into a data string; and a data bit extracting unit 24 for removing the synchronizing pattern and DSV control bits remaining as redundant bits and inserted at predetermined intervals from an output of the demodulating unit 23, and extracting data bits.

In addition, though not shown, a timing managing unit for generating a timing signal and supplying the timing signal to various parts to manage timing is provided.

Figure 2:
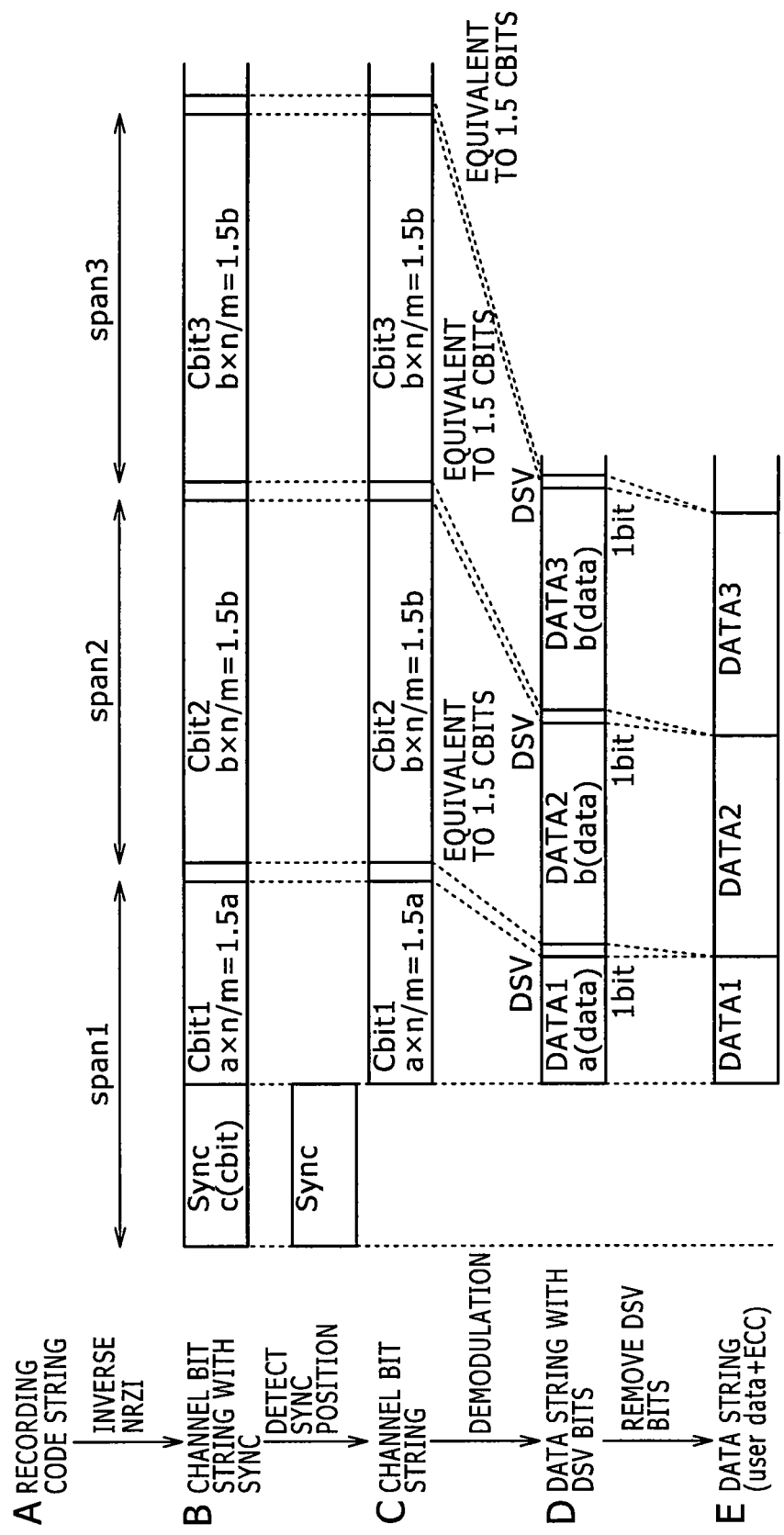
FIGS. 2A, 2B, 2C, 2D, and 2E are diagrams of assistance in explaining data formats.

FIGS. 2A, 2B, 2C, 2D, and 2E are diagrams showing data formats in parts of the demodulating device 1 of FIG. 1. A reproduced signal string (FIG. 2A) reproduced from the recording medium 11 by the reproducing unit 12 is input to the channel bit string converting unit 21 to be output as a channel bit string with sync (a channel bit string including a synchronizing pattern) (FIG. 2B). The synchronizing pattern detection processing unit 22 detects the sync (synchronizing pattern) from the channel bit string with the sync output from the channel bit string converting unit 21, and then outputs the timing signal to the demodulating unit 23 and the data bit extracting unit 24.

The sync (synchronizing pattern) is formed by c channel bits. The demodulating unit 23 demodulates the channel bit string with the sync input from the channel bit string converting unit 21, and then outputs a data string with DSV bits (FIG. 2D). Supposing that DSV sections (DATA1, DATA2, and DATA3) of the data string are a-bit data, b-bit data, and b-bit data, respectively, a channel bit section after modulation of each of the DSV sections (DATA1, DATA2, and DATA3) is (a×3/2)=(1.5a) or (b×3/2)=(1.5b) because the conversion rate m:n of the modulation table is 2:3. Since this channel bit section is demodulated (decoded), the DSV sections (DATA1, DATA2, and DATA3) of the data string with the DSV bits are a-bit data, b-bit data, and b-bit data, respectively.

In this example, because the sync (SYNC) is inserted at a predetermined position (a start position in front of the position of DATA1 in this example), letting c (cbits) be the number of channel bits of the SYNC, a relation 1.5a+c=1.5b holds between a, b, and c. That is, span1, span2, span3, . . . representing the lengths of the respective DSV sections have a same length, so that DSV control is performed at equal intervals.

One DSV control bit in FIG. 2D is equivalent to 1.5 channel bits in a channel bit string. That is, one bit is inserted as a DSV control bit in a data string, and is therefore increased by an amount corresponding to the conversion rate in terms of channel bits. Thus the following relation holds: 1 bit×n/m=1×3/2=1.5 channel bits. Comparing this with a conventional system, for example, two channel bits are required to perform DSV control in channel bits while keeping the minimum run d=1. Alternatively, four channel bits are required to perform DSV control in channel bits while keeping both the minimum run and the maximum run. Thus, as compared with the conventional DSV control system, the insertion of DSV control bits in a data string by the present system can be performed with fewer redundant channel bits for DSV control.

The data bit extracting unit 24 removes the sync (synchronizing pattern) and the DSV control bits from the data string with the DSV bits output from the demodulating unit 23, and thereby extracts data bits (FIG. 2E). This demodulated data string is supplied to the outputting unit 14.

FIG. 3 is a block diagram showing details of configuration of main parts of the decoding device 13 in FIG. 1. As shown in the figure, the demodulating unit 23 includes an inverse conversion pattern processing unit 41, a minimum run successive occurrence limiting inverse conversion pattern processing unit 42, a pattern detection prediction processing unit 43, and an inverse conversion pattern determining unit 44.

FIG. 4 is a block diagram showing a more detailed configuration of the decoding device 13 of FIG. 3. As shown in FIG. 4, the inverse conversion pattern processing unit 41 includes an inverse conversion pattern detecting unit 81 and inverse conversion tables 82A to 82D. The minimum run successive occurrence limiting inverse conversion pattern processing unit 42 includes a minimum run successive occurrence limiting inverse conversion pattern detecting unit 71 and minimum run successive occurrence limiting inverse conversion tables 72A and 72B. The pattern detection prediction processing unit 43 includes a minimum run successive occurrence limiting inverse conversion pattern detection prediction processing unit 61.

A reproduced signal input in FIG. 4 is a recording code string (or a transmission code string when input from a transmission line) reproduced from the recording medium 11 by the reproducing unit 12. When the input reproduced signal is level code in a binarized state such as "111 100 110 000 00 . . . " or the like, the channel bit string converting unit 21 performs inverse NRZI modulation by outputting "1" for a position where "0" or "1" as an input value is inverted, thereby converts the input reproduced signal into a channel bit string, and then outputs the channel bit string. The output from the channel bit string converting unit 21 is supplied to the synchronizing pattern detection processing unit 22, the inverse conversion pattern detecting unit 81, the minimum run successive occurrence limiting inverse conversion pattern detecting unit 71, and the minimum run successive occurrence limiting inverse conversion pattern detection prediction processing unit 61.

The synchronizing pattern detection processing unit 22 detects a synchronizing pattern inserted in a predetermined position at a predetermined interval from the channel bit string supplied from the channel bit string converting unit 21 to indicate a position at which to start demodulation processing in a subsequent stage. The synchronizing pattern detection processing unit 22 also supplies information necessary for the demodulation processing to the inverse conversion pattern detecting unit 81, the minimum run successive occurrence limiting inverse conversion pattern detecting unit 71, the minimum run successive occurrence limiting inverse conversion pattern detection prediction processing unit 61, the inverse conversion pattern determining unit 44, and the data bit extracting unit 24. The parts use this information as positional information for starting respective processes.

The inverse conversion pattern detecting unit 81 detects an inverse conversion pattern for keeping the RLL rule from the channel bit string. The inverse conversion pattern detecting unit 81 outputs inverse conversion pattern determination information as information on a result of the detection to the inverse conversion pattern determining unit 44, and also outputs the inverse conversion pattern determination information to each of the inverse conversion tables 82A to 82D. Each of the inverse conversion tables 82A to 82D supplies a detected inverse conversion pattern (converted data string) to the inverse conversion pattern determining unit 44. In addition, the inverse conversion pattern processing unit 41 has the inverse conversion table of the termination table used as needed to insert a synchronizing pattern. The inverse conversion pattern processing unit 41 refers to a first bit of the immediately succeeding synchronizing pattern to determine data bits, and thereafter performs the same process.

When the minimum run successive occurrence limiting inverse conversion pattern detecting unit 71 detects an inverse conversion pattern for limiting the number of successive occurrences of the minimum run from the channel bit string, the minimum run successive occurrence limiting inverse conversion pattern detecting unit 71 outputs the information as minimum run successive occurrence limiting inverse conversion pattern detection information to the inverse conversion pattern determining unit 44, and also outputs the information to each of the minimum run successive occurrence limiting inverse conversion tables 72A and 72B. Each of the minimum run successive occurrence limiting inverse conversion tables 72A and 72B supplies a detected inverse conversion pattern (converted data string) to the inverse conversion pattern determining unit 44.

When the minimum run successive occurrence limiting inverse conversion pattern detection prediction processing unit 61 detects a predetermined inverse conversion pattern of inverse conversion patterns for limiting the number of successive occurrences of the minimum run at a predetermined position other than a start of the channel bit string, the minimum run successive occurrence limiting inverse conversion pattern detection prediction processing unit 61 outputs the information as minimum run successive occurrence limiting inverse conversion pattern detection prediction processing information to the inverse conversion pattern determining unit 44.

The inverse conversion pattern determining unit 44 determines and selects an inverse conversion pattern to be used from the outputs of the inverse conversion data strings from the inverse conversion tables 82A to 82D and the minimum run successive occurrence limiting inverse conversion tables 72A and 72B, using the information from the inverse conversion pattern detecting unit 81, the minimum run successive occurrence limiting inverse conversion pattern detecting unit 71, and the minimum run successive occurrence limiting inverse conversion pattern detection prediction processing unit 61. The inverse conversion pattern determining unit 44 outputs the selected inverse conversion pattern to the data bit extracting unit 24. Then, the data bit extracting unit 24 extracts data bits by removing the synchronizing pattern and DSV control bits remaining as redundant bits and inserted at predetermined intervals. The data bit extracting unit 24 outputs the data bits as a demodulated data string.

Besides, timing of operation of each part is managed in synchronism with a timing signal supplied from the timing managing unit not shown in the figure.

Incidentally, means for removing the synchronizing pattern is not limited to that in FIG. 3 and FIG. 4. For example, the inverse conversion pattern determining unit 44 may be configured to remove the synchronizing pattern as exceptional processing. In that case, it suffices for the data bit extracting unit 24 to remove only the DSV control bits inserted at predetermined intervals.

Correspondences between FIG. 4 and Table 4 are illustrated as follows. The minimum run successive occurrence limiting inverse conversion pattern detecting unit 71 operates when the input channel bit string is "001 000 000" in Table 4 and further a following channel bit string is "010" (not "100"), or when the input channel bit string is "101 010 000 000 101" or "000 010 000 000 101". The minimum run successive occurrence limiting inverse conversion pattern detection prediction processing unit 61 operates when a fourth bit and subsequent bits of the input channel bit string are "000 010 000 000 101" in Table 4.

When the outputs from the inverse conversion tables 82A to 82D and the outputs from the minimum run successive occurrence limiting inverse conversion tables 72A and 72B overlap each other, the inverse conversion pattern determining unit 44 selects one of the outputs using the information from the inverse conversion pattern detecting unit 81, the minimum run successive occurrence limiting inverse conversion pattern detecting unit 71, and the minimum run successive occurrence limiting inverse conversion pattern detection prediction processing unit 61. When for example "001" with a constraint length i=1 and "001 000 000"+"010" with a constraint length i=3 overlap each other in Table 4, the output from the minimum run successive occurrence limiting inverse conversion table 72A with the longer constraint length (latter) is selected. In addition, when for example "101" with a constraint length i=1 and "101 010 000 000 101" with a constraint length i=5 overlap each other in Table 4, or when "000" with a constraint length i=1 and "000 010 000 000 101" with a constraint length i=5 overlap each other, the output from the minimum run successive occurrence limiting inverse conversion table 72B with the longer constraint length (latter) is selected. Further, when for example "010 000" with a constraint length i=2 and "010 000 010 000 000 101" overlap each other in Table 4 (when codes immediately preceding "000 010 000 000 101" with a constraint length i=5 are "010" (when a result of determination in step S169 in FIG. 10 to be described later is yes, that is, when a result of determination in step S241 in FIG. 11 is yes)), three channel bits "010" are output on the basis of the output from the minimum run successive occurrence limiting inverse conversion pattern detection prediction processing unit 61.

Operation of the demodulating device 1 is described with reference to a flowchart of FIG. 5. In step S1, the reproducing unit 12 reproduces the recording medium 11. In step S2, the channel bit string converting unit 21 converts reproduced code supplied from the reproducing unit 12 into a channel bit string. In step S3, the synchronizing pattern detection processing unit 22 detects a synchronizing pattern. Information based on a result of the detection is output to each part.

In step S4, the pattern detection prediction processing unit 43 performs a pattern detection predicting process. Though details of the pattern detection predicting process will be described later with reference to a flowchart of FIG. 6, this process outputs a prediction flag in an on state when a predetermined code pattern "xxx 000 010 000 000 101" is detected.

In step S5, the minimum run successive occurrence limiting inverse conversion pattern processing unit 42 performs a minimum run successive occurrence limiting inverse conversion pattern process. Though details of the minimum run successive occurrence limiting inverse conversion pattern process will be described later with reference to a flowchart of FIG. 7, this process outputs a minimum run successive occurrence limiting inverse conversion pattern detection flag (15 cbits) in an on state when for example the code pattern "000 010 000 000 101" or the code pattern "101 010 000 000 101" is detected. In addition, when the code pattern "001 000 000 010" is detected, a minimum run successive occurrence limiting inverse conversion pattern detection flag (nine cbits) in an on state is output.

In step S6, the inverse conversion pattern processing unit 41 performs an inverse conversion pattern process. Though details of the inverse conversion pattern process will be described later with reference to FIG. 8, this process performs inverse conversion by the inverse conversion tables 82A to 82D.

Incidentally, the processes of steps S4 to S6 are performed in parallel with each other in practice.

In step S7, the inverse conversion pattern determining unit 44 performs an inverse conversion pattern determining process. Though details of the inverse conversion pattern determining process are described later with reference to a flowchart of FIG. 11, this process selects one of the data patterns supplied from the inverse conversion tables 82A to 82D and the data patterns supplied from the minimum run successive occurrence limiting inverse conversion tables 72A and 72B, and then supplies the selected data pattern to the data bit extracting unit 24.

In step S8, the data bit extracting unit 24 extracts data bits. That is, the data bits are extracted by removing a synchronizing pattern and DSV control bits. In step S9, the outputting unit 14 subjects the demodulated data string input from the data bit extracting unit 24 to descrambling and error correction by ECC. Thus, a significant data string such as image data, audio data or the like is generated, and then output to a display unit such as an LCD, a CRT or the like, a speaker, or the like. Alternatively, the data string is further encoded in a predetermined format as needed, and then supplied to various devices or a transmission line or recorded onto a recording medium.

Figure 5:
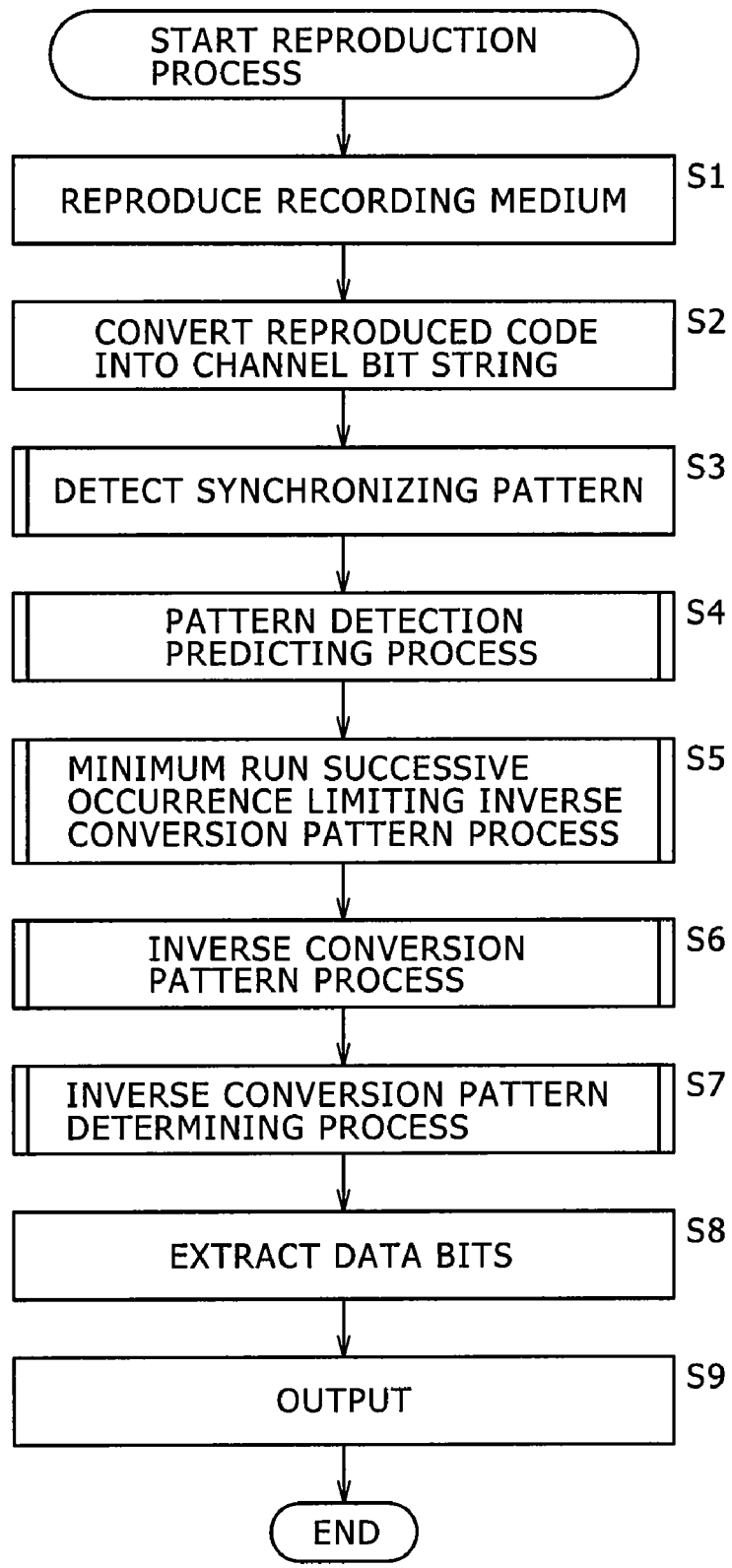
FIG. 5 is a flowchart of assistance in explaining a reproduction process of the demodulating device of FIG. 1.

FIG. 6 shows details of the pattern detection predicting process in step S4 in FIG. 5.

In step S31, the minimum run successive occurrence limiting inverse conversion pattern detection prediction processing unit 61 in the pattern detection prediction processing unit 43 determines whether a channel bit string input from the channel bit string converting unit 21 is a code pattern "xxx 000 010 000 000 101". When the codeword matches this code pattern, the minimum run successive occurrence limiting inverse conversion pattern detection prediction processing unit 61 in step S32 outputs a minimum run successive occurrence limiting inverse conversion pattern detection predicting flag in an on state.

When the minimum run successive occurrence limiting inverse conversion pattern detection prediction processing unit 61 determines in step S31 that the input channel bit string does not match the code pattern "xxx 000 010 000 000 101", the minimum run successive occurrence limiting inverse conversion pattern detection prediction processing unit 61 in step S33 outputs the minimum run successive occurrence limiting inverse conversion pattern detection predicting flag in an off state.

Figure 10:
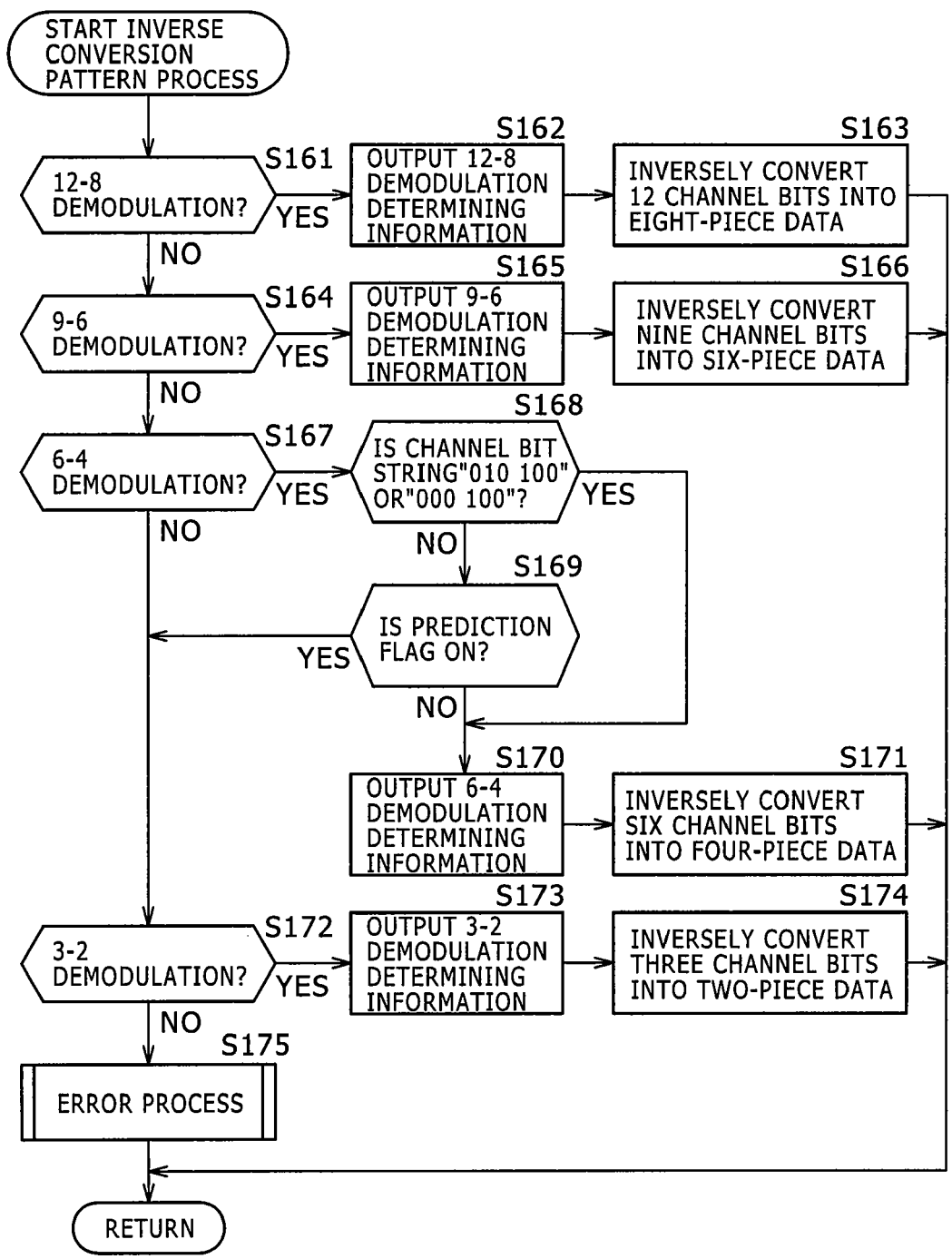
FIG. 10 is a flowchart of assistance in explaining another embodiment of the inverse conversion pattern process in step S6 in FIG. 5.

This minimum run successive occurrence limiting inverse conversion pattern detection predicting flag is used in step S169 in FIG. 10 and step S241 in FIG. 11.

Figure 7:
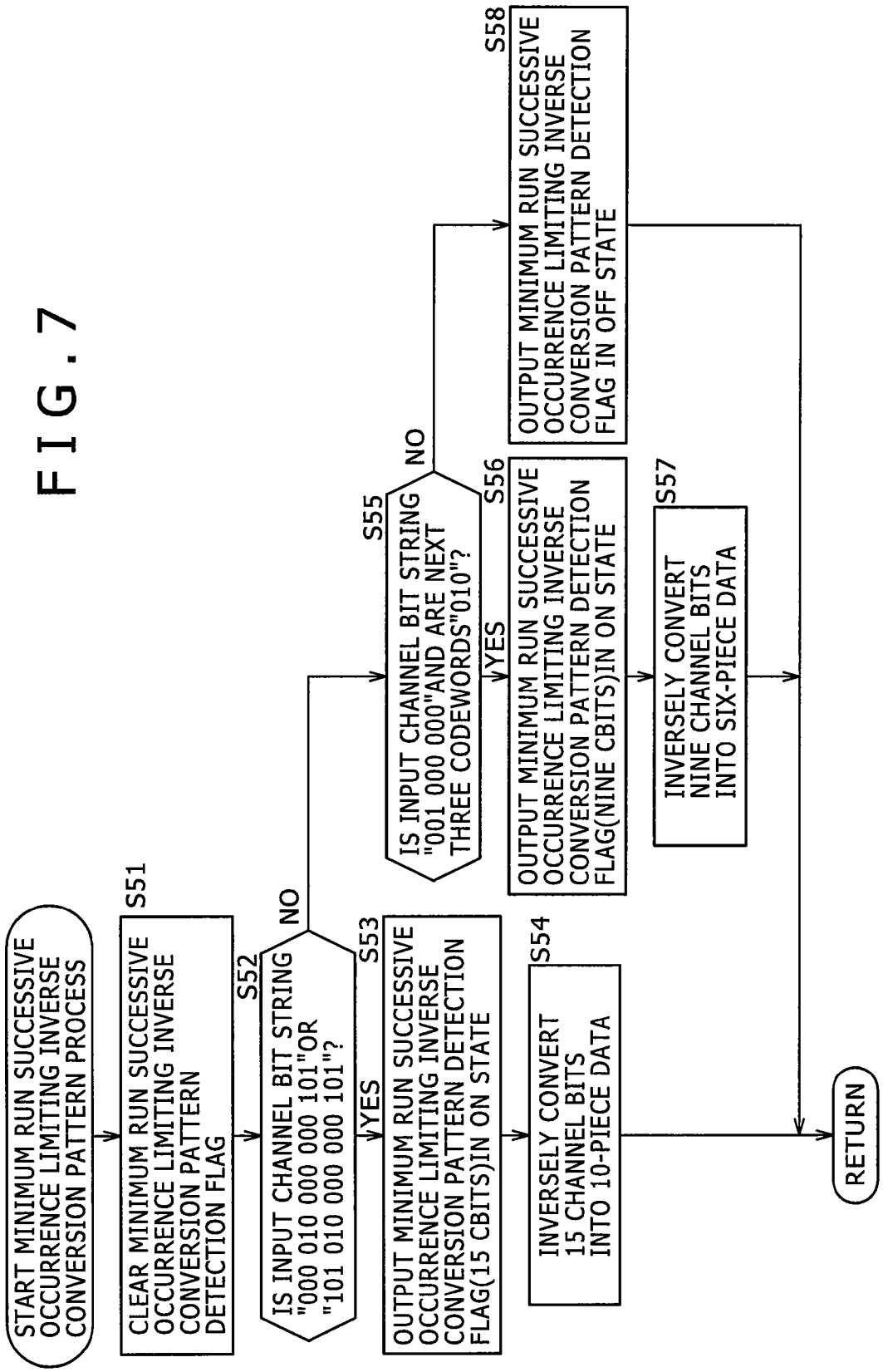
FIG. 7 is a flowchart of assistance in explaining a minimum run successive occurrence limiting inverse conversion pattern process in step S5 in FIG. 5.

FIG. 7 shows details of the minimum run successive occurrence limiting inverse conversion pattern process in step S5 in FIG. 5.

In step S51, the minimum run successive occurrence limiting inverse conversion pattern detecting unit 71 in the minimum run successive occurrence limiting inverse conversion pattern processing unit 42 clears a detection flag. That is, the minimum run successive occurrence limiting inverse conversion pattern detecting unit 71 clears a minimum run successive occurrence limiting inverse conversion pattern detection flag (15 cbits) and a minimum run successive occurrence limiting inverse conversion pattern detection flag (nine cbits) output in steps S53 and S56 to be described later. In step S52, the minimum run successive occurrence limiting inverse conversion pattern detecting unit 71 in the minimum run successive occurrence limiting inverse conversion pattern processing unit 42 determines whether the input channel bit string is a code pattern "000 010 000 000 101" or a code pattern "101 010 000 000 101". When the input channel bit string matches these code patterns, the minimum run successive occurrence limiting inverse conversion pattern detecting unit 71 in step S53 outputs the minimum run successive occurrence limiting inverse conversion pattern detection flag (15 cbits) in an on state. This flag is output to the inverse conversion pattern determining unit 44 and the minimum run successive occurrence limiting inverse conversion tables 72A and 72B.

In step S54, the minimum run successive occurrence limiting inverse conversion table 72B inversely converts the 15 channel bits into 10-piece data. That is, as shown in Table 4, when the code pattern "101 010 000 000 101" is input, and when the channel bit string "000 010 000 000 101" is input, a data pattern (1001110111) is output.

The flag output in step S53 is used in step S231 in FIG. 11. The data pattern converted in step S54 is selected and output in step S232 in FIG. 11.

When the minimum run successive occurrence limiting inverse conversion pattern detecting unit 71 determines in step S52 that the input channel bit string does not match the predetermined code pattern "000 010 000 000 101" or "101

010 000 000 101", the minimum run successive occurrence limiting inverse conversion pattern detecting unit 71 in step S55 determines whether the channel bit string matches a code pattern "001 000 000" and whether next three codewords are "010". In other words, the minimum run successive occurrence limiting inverse conversion pattern detecting unit 71 determines whether the channel bit string matches a code pattern "001 000 000 010". When the channel bit string matches this pattern, the minimum run successive occurrence limiting inverse conversion pattern detecting unit 71 in step S56 outputs the minimum run successive occurrence limiting inverse conversion pattern detection flag (nine cbits) in an on state. This flag is output to the inverse conversion pattern determining unit 44 and the minimum run successive occurrence limiting inverse conversion tables 72A and 72B.

In step S57, the minimum run successive occurrence limiting inverse conversion table 72A inversely converts the nine channel bits into six-piece data. That is, the codeword string "001 000 000" is converted into a data pattern (110111).

The flag output in step S56 is used in step S233 in FIG. 11. The data converted in step S57 is selected and output in step S234 in FIG. 11.

When the minimum run successive occurrence limiting inverse conversion pattern detecting unit 71 determines in step S55 that the channel bit string does not match the code pattern "001 000 000" or that the next three codewords do not match the code pattern "010", that is, when the codeword string does not match the code pattern "001 000 000" or when the codeword string matches the code pattern "001 000 000" but the next codes do not match the code pattern "010", the minimum run successive occurrence limiting inverse conversion pattern detecting unit 71 in step S58 outputs the minimum run successive occurrence limiting inverse conversion pattern detection flag in an off state. The minimum run successive occurrence limiting inverse conversion pattern detection flag being in the off state means that the minimum run successive occurrence limiting inverse conversion pattern detection flag (15 cbits) in step S53 is off and that the minimum run successive occurrence limiting inverse conversion pattern detection flag (nine cbits) in step S56 is off.

Details of the inverse conversion pattern process in step S6 in FIG. 5 are described with reference to a flowchart of FIG. 8.

In step S101, the inverse conversion pattern detecting unit 81 in the inverse conversion pattern processing unit 41 determines whether the input channel bit string is for 12-8 demodulation. Specifically, the inverse conversion pattern detecting unit 81 determines whether the code string matches a code pattern "000 100 100 100" or "010 100 100 100" with a constraint length i=4 in Table 4 (the same is true for other constraint lengths). When the inverse conversion pattern detecting unit 81 determines that the input channel bit string is for 12-8 demodulation, the inverse conversion pattern detecting unit 81 in step S102 outputs 12-8 demodulation determining information. The 12-8 demodulation determining information is supplied to the inverse conversion pattern determining unit 44 and the inverse conversion tables 82A to 82D. In step S103, the inverse conversion table 82D inversely converts the 12 channel bits into eight-piece data. That is, the code pattern "000 100 100 100" of the channel bit string is converted into a data pattern (00001000), or the code pattern "010 100 100 100" of the channel bit string is converted into a data pattern (00000000).

The information output in step S102 is used in step S235 in FIG. 11. The data converted in step S103 is selected and output in step S236 in FIG. 11.

When the inverse conversion pattern detecting unit 81 determines in step S101 that the channel bit string is not for 12-8 demodulation, the inverse conversion pattern detecting unit 81 determines in step S104 whether the channel bit string is for 9-6 demodulation. That is, the inverse conversion pattern detecting unit 81 determines in step S104 whether the channel bit string matches a code pattern "000 100 100", "000 100 000", "010 100 100", or "010 100 000" with a constraint length i =3 in Table 4. When the inverse conversion pattern detecting unit 81 determines that the channel bit string is for 9-6 demodulation, the inverse conversion pattern detecting unit 81 in step S105 outputs 9-6 demodulation determining information. This determining information is supplied to the inverse conversion pattern determining unit 44 and the inverse conversion tables 82A to 82D. In step S106, the inverse conversion table 82C inversely converts the nine channel bits into six-piece data. Specifically, the inverse conversion table 82C converts the code pattern "000 100 100", "000 100 000" (when next channel bits are not "100"), "010 100 100", or "010 100 000" (when next channel bits are not "100") into a data pattern (000011), (000010), (000001), or (000000), respectively.

The information output in step S105 is used in step S237 in FIG. 11. The data converted in step S106 is selected and output in step S238 in FIG. 11.

When the inverse conversion pattern detecting unit 81 determines in step S104 that the channel bit string is not for 9-6 demodulation, the inverse conversion pattern detecting unit 81 determines in step S107 whether the channel bit string is for 6-4 demodulation. That is, the inverse conversion pattern detecting unit 81 determines whether the channel bit string matches a code pattern "010 100", "010 000", or "000 100" with a constraint length i=2 in Table 4. When the inverse conversion pattern detecting unit 81 determines that the channel bit string is for 6-4 demodulation, the inverse conversion pattern detecting unit 81 in step S108 outputs 6-4 demodulation determining information. This determining information is supplied to the inverse conversion pattern determining unit 44 and the inverse conversion tables 82A to 82D. In step S109, the inverse conversion table 82B inversely converts the six channel bits into four-piece data. Specifically, inverse conversion at a constraint length i=2 in Table 4 is performed. That is, the code pattern "010 100", "010 000" (when next channel bits are not "100"), or "000 100" is converted into a data pattern (0011), (0010), or (0001), respectively.

In step S110, the inverse conversion pattern detecting unit 81 determines whether the six channel bits is the code pattern "010 100" or "000 100". When the six channel bits matches these code patterns, the inverse conversion pattern process is ended. On the other hand, when the six channel bits does not match these code patterns (when the six channel bits is the code pattern "010 000"), the process proceeds to step S111. The process proceeds to step S111 also when the inverse conversion pattern detecting unit 81 determines in step S107 that the channel bit string is not for 6-4 demodulation.

In step S111, the inverse conversion pattern detecting unit 81 determines whether the channel bit string is for 3-2 demodulation. That is, the inverse conversion pattern detecting unit 81 determines whether the channel bit string matches a code pattern "101", "000", "001", or "010" with a constraint length i=1 in Table 4. When the channel bit string is for 3-2 demodulation, the inverse conversion pattern detecting unit 81 in step S112 outputs 3-2 demodulation determining information. This determining information is supplied to the inverse conversion pattern determining unit 44 and the inverse conversion tables 82A to 82D. This information is used in step S243 in FIG. 1. In step S113, the inverse conversion table 82A inversely converts the three channel bits into two-piece data. Specifically, as shown in the part at the constraint length i=1 of Table 4, the code pattern "101", "000", "001", or "010" is converted into a data pattern (11), (11), (10), or (01), respectively. These pieces of data are selected and output in step S244 in FIG. 11.

When the inverse conversion pattern detecting unit 81 determines in step Sll that the channel bit string is not for 3-2 demodulation, the inverse conversion pattern detecting unit 81 in step S114 performs an error process.

That is, when a pattern not described in Table 4 appears, a process of 3-2 inverse conversion for a minimum processing unit is performed. Details of the error process are shown in a flowchart of FIG. 9.

Figure 9:
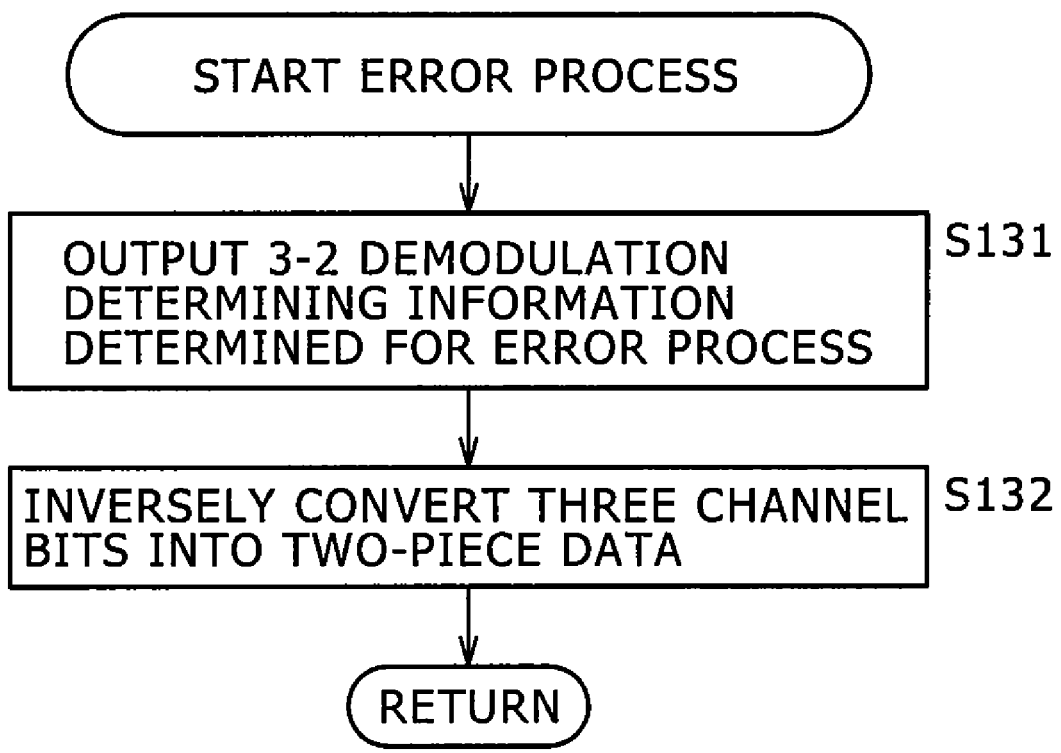
FIG. 9 is a flowchart of assistance in explaining an error process in step S114 in FIG. 8.

As shown in FIG. 9, the inverse conversion pattern detecting unit 81 in step S131 outputs 3-2 demodulation determining information predetermined for the error process. This determining information is supplied to the inverse conversion pattern determining unit 44 and the inverse conversion tables 82A to 82D. In step S132, the inverse conversion table 82A inversely converts three channel bits predetermined for the error process into two-piece data. That is, one of the code patterns "101", "000", "001", and "010" is set as a code pattern for the error process, and the code pattern is converted into a corresponding data pattern.

Alternatively, a data pattern used exclusively for errors is prepared, and three channel bits may be inversely converted into two-piece data (00) for the error process, for example.

A flowchart of FIG. 10 represents another embodiment of the inverse conversion pattern process in step S6 in FIG. 5. When the inverse conversion pattern process of FIG. 10 is performed, the minimum run successive occurrence limiting inverse conversion pattern detection prediction processing information output by the minimum run successive occurrence limiting inverse conversion pattern detection prediction processing unit 61 is supplied to the inverse conversion pattern detecting unit 81, as shown by a dotted line in FIG. 4.

Figure 8:
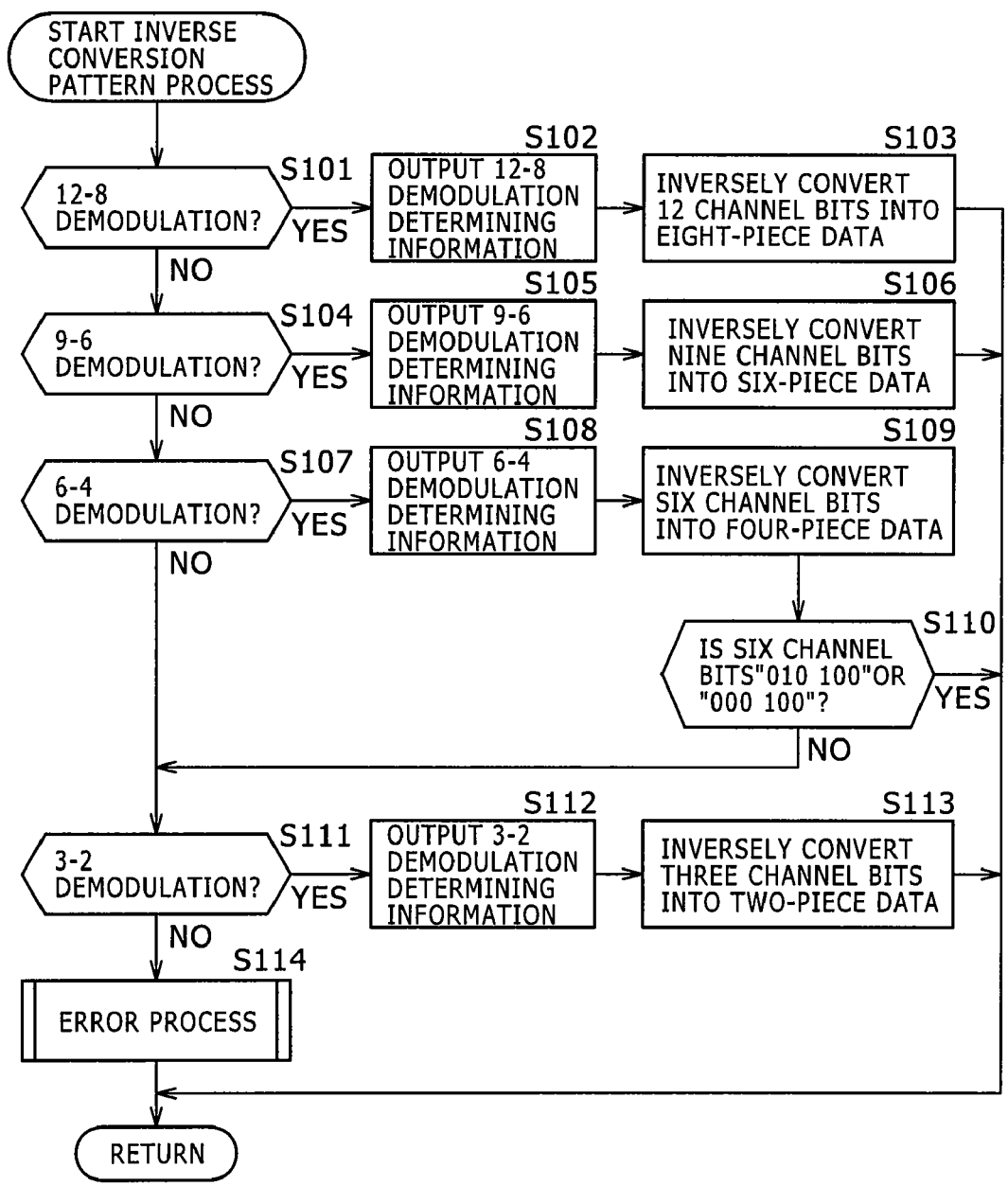
FIG. 8 is a flowchart of assistance in explaining an inverse conversion pattern process in step S6 in FIG. 5.

The process of steps S161 to S175 is basically the same as the process of steps S101 to S114 in FIG. 8. However, the process of steps S168 to S171 when a result of a process of determining whether the channel bit string is for 6-4 demodulation in step S167 in FIG. 10 is yes is different from the process of steps S108 to S110 when a result of a process of determining whether the channel bit string is for 6-4 demodulation in step S107 in FIG. 8 is yes.

Specifically, in steps S161 to S166 in the process of FIG. 10, the same process as in steps S101 to S106 in FIG. 8 is performed. Then, when determining in step S167 in FIG. 10 corresponding to step S107 in FIG. 8 that the channel bit string is for 6-4 demodulation, the inverse conversion pattern detecting unit 81 determines in step S168 whether the channel bit string matches the code pattern "010 100" or "000 100". When the channel bit string does not match these code patterns (when the channel bit string matches the code pattern "010 000"), the inverse conversion pattern detecting unit 81 determines in step S169 whether the minimum run successive occurrence limiting inverse conversion pattern detection predicting flag is on. As described above, in the present embodiment, the minimum run successive occurrence limiting inverse conversion pattern detection prediction processing information is supplied from the minimum run successive occurrence limiting inverse conversion pattern detection prediction processing unit 61 to the inverse conversion pattern detecting unit 81.

When the inverse conversion pattern detecting unit 81 determines in step S169 that the minimum run successive occurrence limiting inverse conversion pattern detection predicting flag is not on (is off) (when the channel bits do not match the code pattern "xxx 000 010 000 000 101"), the inverse conversion pattern detecting unit 81 in step S170 outputs 6-4 demodulation determining information. This determining information is supplied to the inverse conversion pattern determining unit 44 and the inverse conversion tables 82A to 82D. This information is used in step S239 in FIG. 11. In next step S171, the inverse conversion table 82B inversely converts the six channel bits into four-piece data. Specifically, the code pattern "010 100", "010 000" (when next channel bits are not "100"), or "000 100" with a constraint length i=2 in Table 4 is converted into a data pattern (0011), (0010), or (0001), respectively. The converted data is selected and output in step S242 in FIG. 11.

When the inverse conversion pattern detecting unit 81 determines in step S168 that the channel bit string is the code pattern "010 100" or "000 100", the process of step S169 is skipped, and the process of steps S170 and S171 is performed.

When the process of step S171 is ended, the process returns to step S7 in FIG. 5.

When it is determined in step S169 that the minimum run successive occurrence limiting inverse conversion pattern detection predicting flag is on, the process proceeds to step S172, where whether the channel bit string is for 3-2 demodulation is determined. The following process is the same as the process of steps S111 to S114 in FIG. 8.

Details of the inverse conversion pattern determining process in step S7 in FIG. 5 will next be described with reference to a flowchart of FIG. 11.

In step S231, the inverse conversion pattern determining unit 44 determines whether the minimum run successive occurrence limiting inverse conversion pattern detection flag (15 cbits) is on. This flag is output in step S53 or S58 in FIG. 7. When the flag is on (when the channel bit string matches the code pattern "000 010 000 000 101" or "101 010 000 000 101"), the inverse conversion pattern determining unit 44 in step S232 selects and outputs the 10-piece data obtained by inversely converting the 15 channel bits. That is, the data inversely converted in step S54 in FIG. 7 is selected and output in step S232.

When the inverse conversion pattern determining unit 44 determines in step S231 that the minimum run successive occurrence limiting inverse conversion pattern detection flag (15 cbits) is not on (is off), the inverse conversion pattern determining unit 44 in step S233 determines whether the minimum run successive occurrence limiting inverse conversion pattern detection flag (nine cbits) is on. This flag is output in step S56 or S58 in FIG. 7. When the flag is on (when the channel bit string matches the code pattern "001 000 000 010"), the inverse conversion pattern determining unit 44 in step S234 selects and outputs the six-piece data obtained by inversely converting the nine channel bits. This data results from the inverse conversion in step S57 in FIG. 7.

When the inverse conversion pattern determining unit 44 determines in step S233 that the minimum run successive occurrence limiting inverse conversion pattern detection flag (nine cbits) is not on (is off), the inverse conversion pattern determining unit 44 in step S235 determines whether the 12-8 demodulation determining information is received. This information is output in step S102 in FIG. 8.

When the inverse conversion pattern determining unit 44 determines in step S235 that the 12-8 demodulation determining information is received (when the channel bit string matches a code pattern with a constraint length i=4), the inverse conversion pattern determining unit 44 in step S236 selects and outputs the eight-piece data obtained by inversely converting the 12 channel bits. This data results from the inverse conversion in step S103 in FIG. 8.

When the inverse conversion pattern determining unit 44 determines in step S235 that the 12-8 demodulation determining information is not received, the inverse conversion pattern determining unit 44 in step S237 determines whether the 9-6 demodulation determining information is received. This information is output in step S105 in FIG. 8. When the 9-6 demodulation determining information is received (when the channel bit string matches a code pattern with a constraint length i=3), the inverse conversion pattern determining unit 44 in step S238 selects and outputs the six-piece data obtained by inversely converting the nine channel bits. This data results from the inverse conversion in step S106 in FIG. 8.

When the inverse conversion pattern determining unit 44 determines in step S237 that the 9-6 demodulation determining information is not received, the inverse conversion pattern determining unit 44 in step S239 determines whether the 6-4 demodulation determining information is received. This information is output in step S108 in FIG. 8. When the 6-4 demodulation determining information is received (when the channel bit string matches a code pattern with a constraint length i=2), the inverse conversion pattern determining unit 44 determines in step S240 whether the channel bit string matches the code pattern "010 100" or "000 100".

When the channel bit string does not match the code pattern "010 100" or "000 100" (when the channel bit string matches "010 000"), the inverse conversion pattern determining unit 44 determines in step S241 whether the minimum run successive occurrence limiting inverse conversion pattern detection predicting flag is on. This prediction flag is supplied from the minimum run successive occurrence limiting inverse conversion pattern detection prediction processing unit 61. When the prediction flag is not on (is off) (when the channel bit string does not match the code pattern "xxx 000 010 000 000 101"), the inverse conversion pattern determining unit 44 in step S242 selects and outputs four-piece data obtained by inversely converting the six channel bits. This data is output in step S109 in FIG. 8.

When the inverse conversion pattern determining unit 44 determines in step S240 that the channel bit string matches the code pattern "010 100" or "000 100", the process of step S241 is skipped, and the process of step S242 is performed.

When the inverse conversion pattern determining unit 44 determines in step S239 that the 6-4 demodulation determining information is not received, or when the inverse conversion pattern determining unit 44 determines in step S241 that the prediction flag is on (when it is determined that the channel bit string matches the code pattern "xxx 000 010 000 000 101" and it is also determined in step S240 that the channel bit string matches the code pattern "010 000" (does not match the code pattern "010 100" or "000 100"), and thus when the channel bit string matches a code pattern "010 000 010 000 000 101"), the inverse conversion pattern determining unit 44 determines in step S243 whether the 3-2 demodulation determining information is received. This information is output in step S112 in FIG. 8. When the 3-2 demodulation determining information is received, the inverse conversion pattern determining unit 44 in step S244 selects and outputs the two-piece data obtained by inversely converting three channel bits. This data results from the inverse conversion in step S113 in FIG. 8.

When the inverse conversion pattern determining unit 44 determines in step S243 that the 3-2 demodulation determining information is not received, the inverse conversion pattern determining unit 44 in step S245 performs an error output process.

Figure 12:
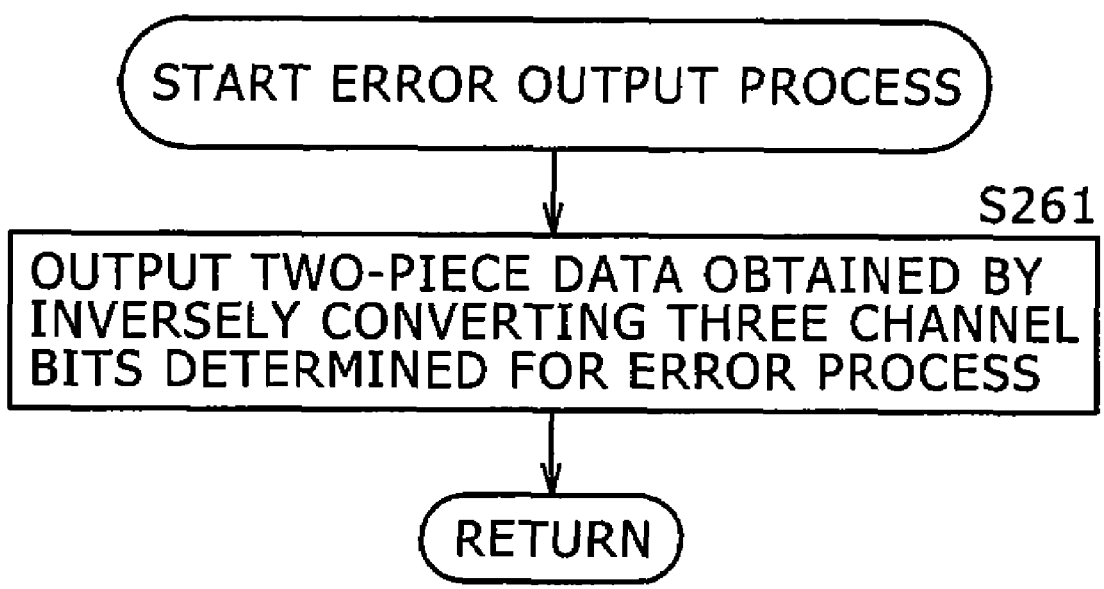
FIG. 12 is a flowchart of assistance in explaining an error output process in step S245 in FIG. 11.

Details of the error output process in step S245 are shown in FIG. 12. In step S261, the inverse conversion pattern determining unit 44 outputs two-piece data obtained by inversely converting three channel bits determined for the error process. Specifically, one of the code patterns "101", "000", "001", and "010" is set in advance for the error process, and of data patterns (11), (11), (10), and (01), a corresponding data pattern is output.

In this error output process, when a separate data pattern is provided exclusively for errors, the data pattern (for example a data pattern (00)) may be output.

Figure 13:
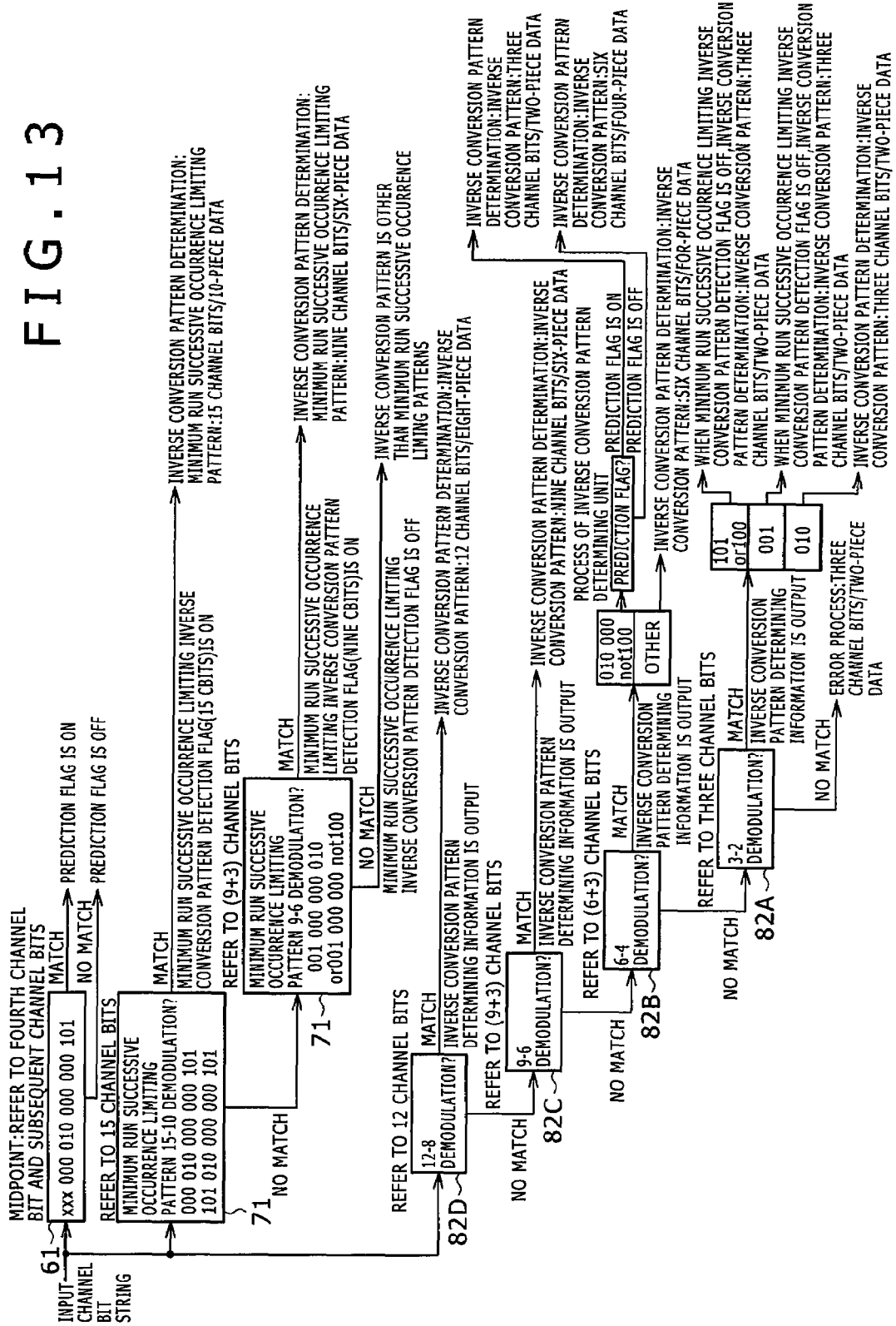
FIG. 13 is a diagram of assistance in explaining processes of a minimum run successive occurrence limiting inverse conversion pattern detection predicting unit, a minimum run successive occurrence limiting inverse conversion pattern detecting unit, and an inverse conversion pattern detecting unit.

The processes of the minimum run successive occurrence limiting inverse conversion pattern detection prediction processing unit 61, the minimum run successive occurrence limiting inverse conversion pattern detecting unit 71, the minimum run successive occurrence limiting inverse conversion tables 72A and 72B, the inverse conversion pattern detecting unit 81, the inverse conversion tables 82A to 82D, and the inverse conversion pattern determining unit 44 are summarized in FIG. 13.

The minimum run successive occurrence limiting inverse conversion pattern detection prediction processing unit 61 determines whether a channel bit string matches the code pattern "xxx 000 010 000 000 101". When the channel bit string matches the code pattern "xxx 000 010 000 000 101", the minimum run successive occurrence limiting inverse conversion pattern detection predicting flag in an on state is output. When the channel bit string does not match the code pattern "xxx 000 010 000 000 101", the minimum run successive occurrence limiting inverse conversion pattern detection predicting flag in an off state is output. "xxx" in the code pattern denotes that these three bits are ignored at the time of detection. Information indicating whether the channel bit string matches the code pattern "xxx 000 010 000 000 101" is output as minimum run successive occurrence limiting inverse conversion pattern detection predicting information.

The minimum run successive occurrence limiting inverse conversion pattern detecting unit 71 determines whether the channel bit string is for 15-10 demodulation, that is, whether the channel bit string matches the code pattern "000 010 000 000 101" or "101 010 000 000 101". When the channel bit string matches the code pattern "000 010 000 000 101" or "101 010 000 000 101", the minimum run successive occurrence limiting inverse conversion pattern detection flag (15 cbits) in an on state is output. Further, data conversion from "000 010 000 000 101" or "101 010 000 000 101" to (1001110111) is performed. When the channel bit string does not match the code pattern "000 010 000 000 101" or "101 010 000 000 101", on the other hand, whether the channel bit string is for 9-6 demodulation is determined. That is, when the channel bit string is the code pattern "001 000 000 010", or when, as another example, the channel bit string is "001 000 000" and a next codeword is not "100", the minimum run successive occurrence limiting inverse conversion pattern detection flag (nine cbits) in an on state is output. Further, data conversion from "001 000 000" to (110111) is performed. When the channel bit string is not for 9-6 demodulation, on the other hand, the minimum run successive occurrence limiting inverse conversion pattern detection flag in an off state is output.

Meanwhile, the inverse conversion pattern detecting unit 81 determines whether the channel bit string is for 12-8 demodulation. When the channel bit string is for 12-8 demodulation, inverse conversion pattern detection determination information is output, and 12 channel bits are inversely converted into eight-piece data by the inverse conversion table 82D.

On the other hand, when the inverse conversion pattern detecting unit 81 determines that the channel bit string is not for 12-8 demodulation, whether the channel bit string is for 9-6 demodulation is determined. When the channel bit string is for 9-6 demodulation, nine channel bits are inversely converted into eight-piece data by the inverse conversion table 82C.

When it is determined that the channel bit string is not for 9-6 demodulation, whether the channel bit string is for 6-4 demodulation is determined. When the channel bit string is for 6-4 demodulation, whether the channel bit string is the code pattern "010 000" and whether next channel bits are not "100" is further determined. When the channel bit string is the code pattern "010 000" and the next channel bits are not "100", whether the minimum run successive occurrence limiting inverse conversion pattern detection predicting flag is on or off is further determined. When the predicting flag is on, three channel bits are inversely converted into two-piece data by the inverse conversion table 82A. When the predicting flag is off, six channel bits are inversely converted into four-piece data by the inverse conversion table 82B.

When the channel bit string is for 6-4 demodulation and the code pattern does not match "010 000"+not "100", six channel bits ("010 000") are inversely converted into four-piece data by the inverse conversion table 82B. The information from the minimum run successive occurrence limiting inverse conversion pattern detection prediction processing unit 61 is used in 6-4 demodulation.

When the channel bit string is not for 6-4 demodulation, whether the channel bit string is for 3-2 demodulation is determined. When the channel bit string is for 3-2 demodulation, three channel bits are inversely converted into two-piece data by the inverse conversion table 82A. When the channel bit string is not for 3-2 demodulation, three channel bits predetermined for an error process are inversely converted into two-piece data. The converted two-piece data is predetermined arbitrarily (for example (00)).

After the inverse conversion pattern is determined, a next detecting process is repeated in timing in which each input channel bit string is advanced within a shift register by an amount corresponding to the determined inverse conversion pattern.

Incidentally, according to the present invention, the demodulation table of Table 4 can also be applied to an RLL code string with a minimum run d=1 and a maximum run k=8 which code string is generated by a table from which the conversion patterns with a constraint length i=4 are omitted, the conversion patterns being substitution patterns for realizing the maximum run k=7 in Table 2, for example. In this case, the demodulation table of Table 4 can be changed to Table 5.

TABLE 5

1,8PP-rmtr5_DEM RLL(1, 8; 2, 3; 5)

| | Code Pattern (Codeword String) | Data Pattern (Demodulated Data String) |
|---|---|---|
| i = 1 | 101 | 11 |
| | 000 | 11 |
| | 001 | 10 |
| | 010 | 01 |
| i = 2 | 010 100 | 0011 |
| | 010 000 (not 100) | 0010 |
| | 000 100 | 0001 |
| i = 3 | 000 100 100 | 000011 |
| | 000 100 000 (not 100) | 000010 |
| | 010 100 100 | 000001 |
| | 010 100 000 (not 100) | 000000 |

TABLE 5-continued 1,8PP-rmtr5_DEM RLL(1, 8; 2, 3; 5)

| | Code Pattern (Codeword String) | Data Pattern (Demodulated Data String) |
|---|---|---|
| | Prohibit Repeated Minimum Transition Runlength | |
| i = 3 | 001 000 000 (not 100) | 110111 |
| i = 5 | 101 010 000 000 101 | 1001110111 |
| | 000 010 000 000 101 | 1001110111 |

Thus, the inverse conversion table of Table 5 is an inverse conversion table for channel bit strings in which RLL code with a minimum run d=1 and a maximum run k=8 is realized by basic patterns from i=1 to i=3 and successive occurrences of the minimum run are limited to a maximum of five times by substitution patterns with i=3 and i=5 for limiting the successive occurrences of the minimum run. With Table 5, it is possible to realize a demodulating device having a configuration similar to that of the above-described embodiment of the present invention.

As described above, the inverse conversion table of Table 4 incorporated in the demodulating device 1 is a 1,7PP code, and further has a plurality of inverse conversion patterns for limiting successive occurrences of the minimum run even though Table 4 has a basic composition similar to that of Table 3 as a conventional inverse conversion table. Therefore the number of successive occurrences of the minimum run is limited to five, and thus an error propagation characteristic can be improved.

The inverse conversion table of Table 4 has substitution codes for limiting the number of times that a minimum run length is repeated in the inverse conversion table with a minimum run d=1, a maximum run k=7 and a conversion rate (m:n)=2:3, thus providing the following effects.

(1) Recording and reproduction at a high linear density and a tolerance for a tangential tilt are improved.

(2) The number of parts with low signal levels is reduced, accuracy of waveform processing of AGC (Auto Gain Control), a PLL (Phase-Locked Loop) and the like is improved, and therefore overall characteristics can be enhanced.

(3) It is possible to make a design with shorter path memory lengths in Viterbi decoding or the like, and reduce a circuit scale, as compared with a conventional system.

In addition, a remainder when the number of "1"s within a codeword string in the inverse conversion table is divided by two and a remainder when the number of "1"s within a demodulated data string is divided by two are both 1 or 0 and thus equal to each other, providing the following effects.

(4) The number of redundant bits for DSV control can be reduced.

(5) At a minimum run d=1 and (m, n)=(2, 3), DSV control can be performed with 1.5 codewords.

(6) In addition to a low level of redundancy, the minimum run and the maximum run can be kept. Further, the present table reduces the limited number of successive occurrences of the minimum run from six to five as compared with the 1,7PP code of Table 3, and can therefore further reduce error propagation at times of data recording and reproduction.

In general, as a pattern of data reproduction errors, an error in which an entire length of successive smallest marks from a first edge to a last edge is shifted can occur. That is, the length of a bit error that occurs extends from a start to an end of the section of the successive smallest marks. Therefore a problem of a long error propagation occurs. By limiting successive occurrences of the minimum run to five times, it is possible to reduce occurrences of the above-described error, and thus realize more stable recording and reproduction of data.

Since the inverse conversion table of Table 4 includes the inverse conversion table of Table 3, a channel bit string generated by the 1,7PP code of Table 2 can be perfectly demodulated into a data string.

Figure 14:
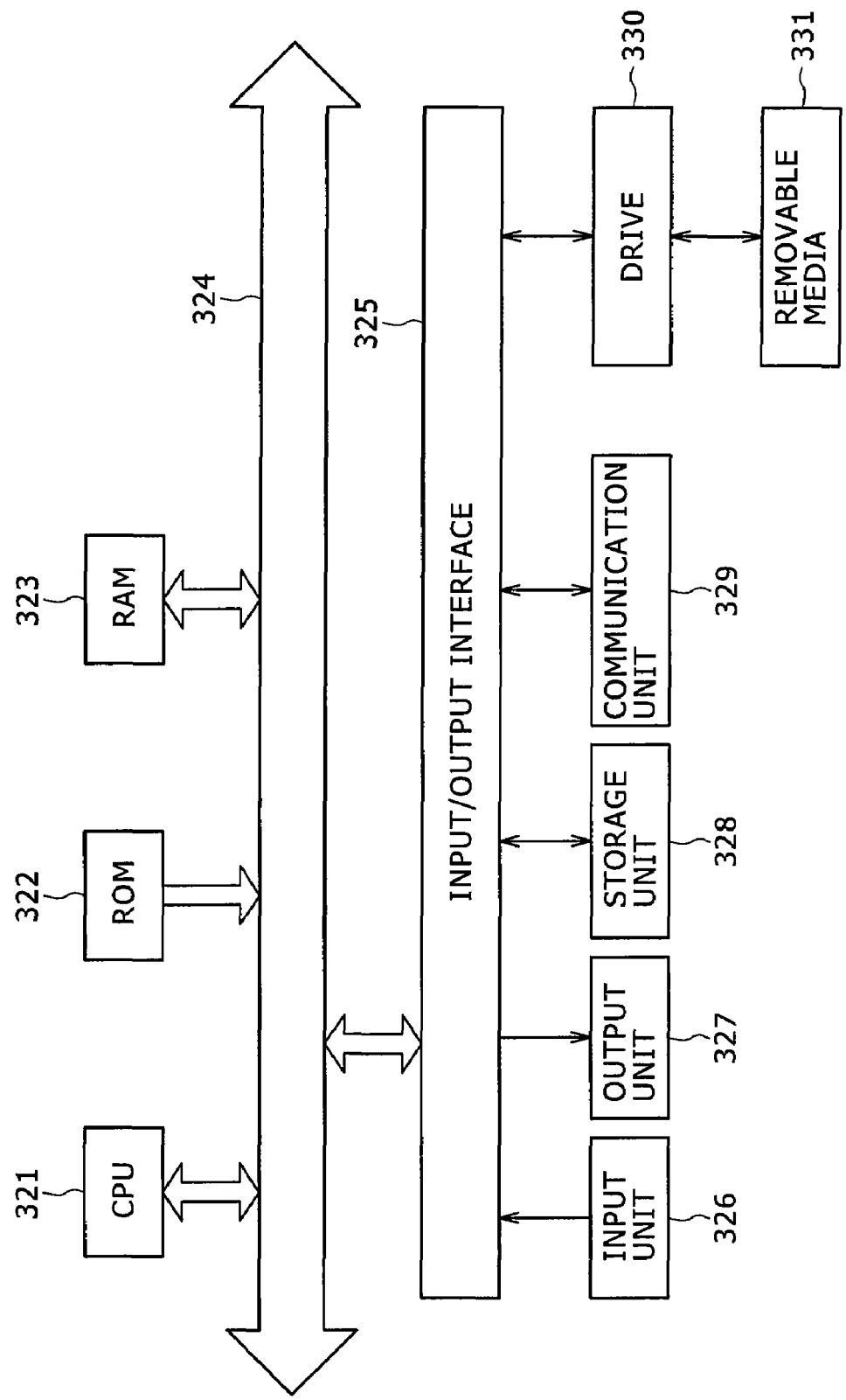
FIG. 14 is a block diagram showing a configuration of a personal computer.

FIG. 14 is a block diagram showing an example of configuration of a personal computer performing the above-described series of processes by a program. A CPU (Central Processing Unit) 321 performs various processes according to a program stored in a ROM (Read Only Memory) 322 or a storage unit 328. A RAM (Random Access Memory) 323 stores the program executed by the CPU 321, data and the like as needed. The CPU 321, the ROM 322, and the RAM 323 are interconnected via a bus 324.

The CPU 321 is also connected with an input-output interface 325 via the bus 324. The input-output interface 325 is connected with an input unit 326 formed by a keyboard, a mouse, a microphone and the like, and an output unit 327 formed by a display, a speaker and the like. The CPU 321 performs various processes in response to a command input from the input unit 326. The CPU 321 then outputs a result of a process to the output unit 327.

The storage unit 328 connected to the input-output interface 325 is formed by a hard disk, for example. The storage unit 328 stores programs to be executed by the CPU 321 and various data. A communication unit 329 communicates with external devices via networks such as the Internet, a local area network and the like. In addition, a program may be obtained via the communication unit 329 and then stored in the storage unit 328.

When removable media 331 such as a magnetic disk, an optical disk, a magneto-optical disk, a semiconductor memory and the like are loaded into a drive 330 connected to the input-output interface 325, the drive 330 drives these removable media 331, and obtains programs, data, and the like recorded on the removable media 331. The obtained programs and data are transferred to the storage unit 328 to be stored therein as needed.

The series of processes described above can be carried out by hardware, also by software. When the series of processes is to be carried out by software, a program constituting the software is installed from a program storage medium onto a computer incorporated in special hardware, or for example a general-purpose personal computer that can perform various functions by installing various programs thereon.

As shown in FIG. 14, the program storage medium storing the program to be installed onto a computer and set in a state of being executable by the computer includes the removable media 331 as packaged media including a magnetic disk (including flexible disks), an optical disk (including CD-ROM (Compact Disk-Read Only Memory) and DVD (Digital Versatile Disk)), a magneto-optical disk (including MD (Mini-Disc) (registered trademark)), a semiconductor memory or the like, or includes the ROM 322, the hard disk forming the storage unit 328, or the like where the program is recorded temporarily or permanently. As needed, the storing of the program on the program storage medium is performed via the communication unit 329 as an interface such as a router, a modem or the like using a wire or wireless communication medium such as a local area network, the Internet, digital satellite broadcasting or the like.

It is to be noted that in the present specification, the steps describing the program stored on the program storage medium include not only processes carried out in time series in the described order but also processes carried out in parallel or individually and not necessarily in time series.

It should be understood by those skilled in the art that various modifications, combinations, sub-combinations and alterations may occur depending on design requirements and other factors insofar as they are within the scope of the appended claims or the equivalents thereof.

The invention is claimed as follows:

1. A demodulation table for converting variable length code (d, k; m, n; r) having a maximum constraint length where r>1, having a minimum run of d, where d>0, a maximum run of k, and a basic codeword length of n bits into data having a basic data length of m bits, said demodulation table comprising:
    a basic table for converting code patterns composed of basic codes having a basic codeword length of n bits into data patterns composed of basic data having a basic data length of m bits; and
    a substitution table for converting code patterns of a plurality of different minimum run successive occurrence limiting patterns determined so as to limit successive occurrences of said minimum run to a maximum of N times into a corresponding identical data pattern, where N>1.

2. The demodulation table according to claim 1, wherein the data pattern corresponding to the code pattern of said minimum run successive occurrence limiting pattern includes a data pattern corresponding to the code pattern of another said minimum run successive occurrence limiting pattern as a part of the data pattern.

3. The demodulation table according to claim 1, further comprising a substitution table for converting code patterns determined so as to limit said maximum run to M into corresponding data patterns, where M>0.

4. The demodulation table according to claim 3, wherein d=1, k=7, m=2, and n=3, and a number of successive occurrences of said minimum run is not greater than five.

5. A demodulating device for converting variable length code (d, k; m, n; r) having a maximum constraint length r>1, having a minimum run of d, where d>0, a maximum run of k, and a basic codeword length of n bits into data having a basic data length of m bits, said demodulating device comprising:
    first converting means for converting an input codeword string into a data string according to a first demodulation table including basic code patterns and basic data patterns associated with the basic code patterns;
    second converting means for converting an input codeword string into a data string according to a second demodulation table including code patterns of a plurality of different minimum run successive occurrence limiting patterns determined so as to limit successive occurrences of said minimum run to a maximum of N times, where N>1, and an identical data pattern associated with the code patterns;
    first detecting means for detecting the code patterns of said minimum run successive occurrence limiting patterns; and
    selecting means for selecting the data string converted according to said second demodulation table when said minimum run successive occurrence limiting pattern is detected.

6. The demodulating device according to claim 5, wherein said selecting means selects a data string converted according to a basic code pattern in a minimum unit and a basic data pattern associated with the basic code pattern.

7. The demodulating device according to claim 5, further comprising codeword string converting means for generating said codeword string from an input signal.

8. The demodulating device according to claim 5, wherein said first demodulation table further includes code patterns determined to limit the maximum run to M, where M>0, and data patterns associated with the code patterns.

9. A demodulating method for converting variable length code (d, k; m, n; r), having a maximum constraint length r>1, having a minimum run of d, where d>0, a maximum run of k, and a basic codeword length of n bits into data having a basic data length of m bits, said demodulating method comprising:
- converting an input codeword string into a data string according to a first demodulation table including basic code patterns and basic data patterns associated with the basic code patterns;
- converting an input codeword string into a data string according to a second demodulation table including code patterns of a plurality of different minimum run successive occurrence limiting patterns determined so as to limit successive occurrences of said minimum run to a maximum of N times, where N>1, and an identical data pattern associated with the code patterns;
- detecting the code patterns of said minimum run successive occurrence limiting patterns; and
- selecting the data string converted according to said second demodulation table when the code pattern of a said minimum run successive occurrence limiting pattern is detected.

10. A computer program product embodied on a computer readable medium for converting variable length code (d, k; m, n; r) having a maximum constraint length r>1, having a minimum run of d, where d>0, a maximum run of k, and a basic codeword length of n bits into data having a basic data length of m bits, said program causing a computer to perform:
- a first converting step of converting an input codeword string into a data string according to a first demodulation table including basic code patterns and basic data patterns associated with the basic code patterns;
- a second converting step of converting an input codeword string into a data string according to a second demodulation table including code patterns of a plurality of different minimum run successive occurrence limiting patterns determined so as to limit successive occurrences of said minimum run to a maximum of N (N>1) times and an identical data pattern associated with the code patterns;
- a detecting step of detecting the code patterns of said minimum run successive occurrence limiting patterns; and
- a selecting step of selecting the data string converted according to said second demodulation table when the code pattern of a said minimum run successive occurrence limiting pattern is detected.

11. A recording medium on which the program of claim 10 is recorded.

12. A demodulating device for converting variable length code (d, k; m, n; r) having a maximum constraint length r>1, having a minimum run of d, where d>0, a maximum run of k, and a basic codeword length of n bits into data having a basic data length of m bits, said demodulating device comprising:
- a first converter for converting an input codeword string into a data string according to a first demodulation table including basic code patterns and basic data patterns associated with the basic code patterns;
- a second converter for converting an input codeword string into a data string according to a second demodulation table including code patterns of a plurality of different minimum run successive occurrence limiting patterns determined so as to limit successive occurrences of said minimum run to a maximum of N (N>1) times and an identical data pattern associated with the code patterns;
- a first detector for detecting the code patterns of said minimum, run successive occurrence limiting patterns; and
- a selector for selecting the data string converted according to said second demodulation table when a said minimum run successive occurrence limiting pattern is detected.

13. A demodulation table for converting variable length code (d, k; m, n; r) having a maximum constraint length where r>1, having a minimum run of d, where d>0, a maximum run of k, and a basic codeword length of n bits into data having a basic data length of m bits, said demodulation table comprising:
- a basic table for converting code patterns composed of basic codes having a basic codeword length of n bits into data patterns composed of basic data having a basic data length of m bits; and
- a substitution table for converting code patterns of a plurality of different minimum run successive occurrence limiting patterns determined so as to limit successive occurrences of said minimum run to a maximum of N times into a corresponding identical data pattern, where N>1, wherein said demodulation table has a conversion rule that a remainder when a number of "1"s within said data pattern is divided by two and a remainder when a number of "1"s within said code pattern is divided by two both be one of 1 and 0, and thus match each other.

14. A demodulating device for converting variable length code (d, k; m, n; r) having a maximum constraint length r>1, having a minimum run of d, where d>0, a maximum run of k, and a basic codeword length of n bits into data having a basic data length of m bits, said demodulating device comprising:
- first converting means for converting an input codeword string into a data string according to a first demodulation table including basic code patterns and basic data patterns associated with the basic code patterns;
- second converting means for converting an input codeword string into a data string according to a second demodulation table including code patterns of a plurality of different minimum run successive occurrence limiting patterns determined so as to limit successive occurrences of said minimum run to a maximum of N times, where N>1, and an identical data pattern associated with the code patterns;
- first detecting means for detecting the code patterns of said minimum run successive occurrence limiting patterns;
- selecting means for selecting the data string converted according to said second demodulation table when said minimum run successive occurrence limiting pattern is detected; and
- second detecting means for detecting a code pattern including the code pattern of at least one said minimum run successive occurrence limiting pattern as a part of the code pattern,
- wherein said selecting means selects one of data strings converted according to a first part of said first demodulation table and a second part of said first demodulation table using a result indicating whether a code pattern including the code pattern of one said minimum run successive occurrence limiting pattern as a part of the code pattern is detected.

15. A demodulating device for converting variable length code (d, k; m, n; r) having a maximum constraint length r>1, having a minimum run of d, where d>0, a maximum run of k, and a basic codeword length of n bits into data having a basic data length of m bits, said demodulating device comprising:

first converting means for converting an input codeword string into a data string according to a first demodulation table including basic code patterns and basic data patterns associated with the basic code patterns;

second converting means for converting an input codeword string into a data string according to a second demodulation table including code patterns of a plurality of different minimum run successive occurrence limiting patterns determined so as to limit successive occurrences of said minimum run to a maximum of N times, where N>1, and an identical data pattern associated with the code patterns;

first detecting means for detecting the code patterns of said minimum run successive occurrence limiting patterns;

selecting means for selecting the data string converted according to said second demodulation table when said minimum run successive occurrence limiting pattern is detected; and extracting means for removing one of a synchronizing pattern and a Digital-Sum-Value control bit inserted at a predetermined position from the data string selected by said selecting means, and extracting data bits.

16. A demodulating device for converting variable length code (d, k; m, n; r) having a maximum constraint length r>1, having a minimum run of d, where d>0, a maximum run of k, and a basic codeword length of n bits into data having a basic data length of m bits, said demodulating device comprising:

first converting means for converting an input codeword string into a data string according to a first demodulation table including basic code patterns and basic data patterns associated with the basic code patterns;

second converting means for converting an input codeword string into a data string according to a second demodulation table including code patterns of a plurality of different minimum run successive occurrence limiting patterns determined so as to limit successive occurrences of said minimum run to a maximum of N times, where N>1, and an identical data pattern associated with the code patterns;

first detecting means for detecting the code patterns of said minimum run successive occurrence limiting patterns;

selecting means for selecting the data string converted according to said second demodulation table when said minimum run successive occurrence limiting pattern is detected; and synchronizing pattern detecting means for detecting a synchronizing pattern inserted at a predetermined position from the input said codeword string.

* * * * *